(12) United States Patent
Baek et al.

(10) Patent No.: US 12,543,345 B2
(45) Date of Patent: Feb. 3, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Sangwon Baek, Suwon-si (KR); Beomjin Park, Suwon-si (KR); Myung Gil Kang, Suwon-si (KR); Dongwon Kim, Suwon-si (KR); Hyumin Yoo, Suwon-si (KR); Namkyu Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 376 days.

(21) Appl. No.: 18/136,975

(22) Filed: Apr. 20, 2023

(65) Prior Publication Data

US 2024/0079466 A1 Mar. 7, 2024

(30) Foreign Application Priority Data

Sep. 2, 2022 (KR) .................. 10-2022-0111661

(51) Int. Cl.
| | | |
|---|---|---|
| *H10D 30/67* | (2025.01) | |
| *H10D 30/01* | (2025.01) | |
| *H10D 30/43* | (2025.01) | |
| *H10D 84/01* | (2025.01) | |
| *H10D 84/03* | (2025.01) | |
| *H10D 84/85* | (2025.01) | |

(52) U.S. Cl.
CPC ....... *H10D 30/6735* (2025.01); *H10D 30/014* (2025.01); *H10D 30/031* (2025.01); *H10D 30/43* (2025.01); *H10D 84/017* (2025.01); *H10D 84/038* (2025.01); *H10D 84/85* (2025.01); *H10D 30/6736* (2025.01)

(58) Field of Classification Search
CPC .... H10D 84/85; H10D 84/017; H10D 84/038; H10D 30/43; H10D 30/031; H10D 30/6736; H10D 30/6735; H10D 30/014
See application file for complete search history.

(56) References Cited

U.S. PATENT DOCUMENTS

| | | | |
|---|---|---|---|
| 9,324,812 B2 | 4/2016 | Yang et al. | |
| 10,181,510 B2 | 1/2019 | Yang et al. | |
| 10,431,585 B2 | 10/2019 | Yang et al. | |
| 11,227,914 B2 | 1/2022 | Shin et al. | |

(Continued)

FOREIGN PATENT DOCUMENTS

KR 10-2022-0080664 A 6/2022

Primary Examiner — Mariceli Santiago
(74) Attorney, Agent, or Firm — Sughrue Mion, PLLC

(57) ABSTRACT

A semiconductor device includes a substrate including an active pattern, a channel pattern on the active pattern, the channel pattern including a plurality of semiconductor patterns spaced apart from each other, a source/drain pattern connected to the plurality of semiconductor patterns, a gate electrode including, an inner electrode between a first semiconductor pattern of the plurality of semiconductor patterns and a second semiconductor pattern of the plurality of semiconductor patterns, the first semiconductor pattern and the second semiconductor pattern being adjacent to each other, and an outer electrode on an uppermost semiconductor pattern of the plurality of semiconductor patterns.

9 Claims, 27 Drawing Sheets

(56) References Cited

U.S. PATENT DOCUMENTS

| | | | |
|---|---|---|---|
| 2017/0256609 A1* | 9/2017 | Bhuwalka | H10D 30/43 |
| 2020/0381555 A1* | 12/2020 | Lee | H10D 30/6757 |
| 2022/0045103 A1* | 2/2022 | Kim | H10D 64/62 |
| 2022/0052046 A1* | 2/2022 | Choi | H10D 30/6211 |
| 2022/0085161 A1 | 3/2022 | Noh et al. | |
| 2022/0157969 A1 | 5/2022 | Yin et al. | |

\* cited by examiner

SEMICONDUCTOR DEVICE AND METHOD OF FABRICATING THE SAME

CROSS-REFERENCE TO RELATED APPLICATION

This application is based on and claims priority to Korean Patent Application No. 10-2022-0111661, filed on Sep. 2, 2022, in the Korean Intellectual Property Office, the disclosure of which is incorporated herein by reference in its entirety.

BACKGROUND

1. Field

Example embodiments of the disclosure relate to a semiconductor device and a method of fabricating the same, and in particular, to a semiconductor device including a field effect transistor (FETs) and a method of fabricating the same.

2. Description of Related Art

A semiconductor device may include an integrated circuit composed of metal-oxide-semiconductor field-effect transistors (MOSFETs). To meet an increasing demand for a semiconductor device with a small pattern size and a reduced design rule, the MOSFETs may be being aggressively scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

In related art, an inner spacer, which may be adjacent to a source/drain pattern, may be formed on an n-type MOSFET (NMOSFET) region. Since the inner spacer is formed of a silicon nitride (e.g., SiN) layer, there may be various issues (e.g., interface trap, border trap, and fixed charge issues) in a region of the inner spacer. Due to a short channel effect, electrical and reliability of characteristics of a semiconductor device may be deteriorated.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided are a semiconductor device with improved reliability and electric characteristics, and a method of fabricating the same.

Additional aspects will be set forth in part in the description which follows and, in part, will be apparent from the description, or may be learned by practice of the presented embodiments.

According to an aspect of an example embodiment, a semiconductor device may include a substrate including an active pattern, a channel pattern on the active pattern, the channel pattern including a plurality of semiconductor patterns spaced apart from each other, a source/drain pattern connected to the plurality of semiconductor patterns, a gate electrode including, an inner electrode between a first semiconductor pattern of the plurality of semiconductor patterns and a second semiconductor pattern of the plurality of semiconductor patterns, the first semiconductor pattern and the second semiconductor pattern being adjacent to each other, and an outer electrode on an uppermost semiconductor pattern of the plurality of semiconductor patterns, and a gate insulating layer including an inner gate insulating layer adjacent to the inner electrode, and an outer gate insulating layer adjacent to the outer electrode, where the inner gate insulating layer includes a first portion between the inner electrode and the source/drain pattern, and a second portion between the inner electrode and the first semiconductor pattern, and where a first thickness of the first portion is about 1.3 times to about 3.0 times a second thickness of the second portion.

According to an aspect of an example embodiment, a semiconductor device may include a substrate including an active pattern, a channel pattern on the active pattern, the channel pattern including a plurality of semiconductor patterns vertically spaced apart from each other, a source/drain pattern connected to the plurality of semiconductor patterns, the source/drain pattern being provided in an n-type metal-oxide-semiconductor field-effect transistor (NMOSFET) region and including n-type impurities, a gate electrode including a plurality of inner electrodes between adjacent semiconductor patterns of the plurality of semiconductor patterns, and an outer electrode on an uppermost semiconductor pattern of the plurality of semiconductor patterns, a gate insulating layer including, a plurality of inner gate insulating layers adjacent to the plurality of inner electrodes, and an outer gate insulating layer adjacent to the outer electrode, where the source/drain pattern includes a first layer contacting the plurality of semiconductor patterns and a second layer on the first layer, where the first layer includes silicon-germanium (SiGe) or silicon-germanium-carbon (SiGeC), and where at least one side surface protruding toward at least one of the plurality of inner gate insulating layers, and a concave side surface contacting a first semiconductor pattern of the plurality of semiconductor patterns.

According to an aspect of an example embodiment, a method of fabricating a semiconductor device may include forming a stacking pattern on a substrate, the stacking pattern including active layers and sacrificial layers alternately stacked on each other, where the active layers comprise a plurality of semiconductor patterns, forming a sacrificial pattern on the stacking pattern, the sacrificial pattern extending in a first direction, forming a recess in the stacking pattern by etching the stacking pattern using the sacrificial pattern as a mask, such that the plurality of semiconductor patterns are exposed by the recess, forming a source/drain pattern in the recess, exposing the plurality of semiconductor patterns by removing the sacrificial pattern and the sacrificial layers, forming a gate insulating layer on the exposed plurality of semiconductor patterns, and forming a gate electrode on the gate insulating layer, where forming a first layer on an inner surface of the recess by performing a first selective epitaxial growth process, forming a second layer on the first layer by performing a second selective epitaxial growth process, where the gate insulating layer includes an inner gate insulating layer adjacent to an inner electrode of the gate electrode and an outer gate insulating layer adjacent to an outer electrode of the gate electrode, where the inner gate insulating layer includes a first portion between the inner electrode and the first layer and second portion between the inner electrode and the plurality of semiconductor patterns, and where a first thickness of the first portion is larger than a second thickness of the second portion.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
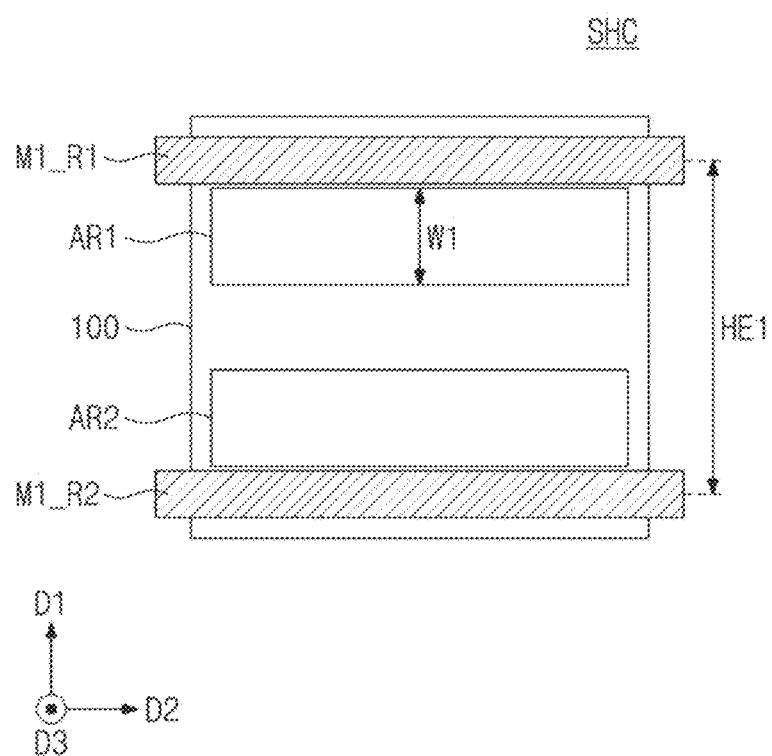
FIGS. 1, 2 and 3 are diagrams illustrating logic cells in a semiconductor device according to an embodiment.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
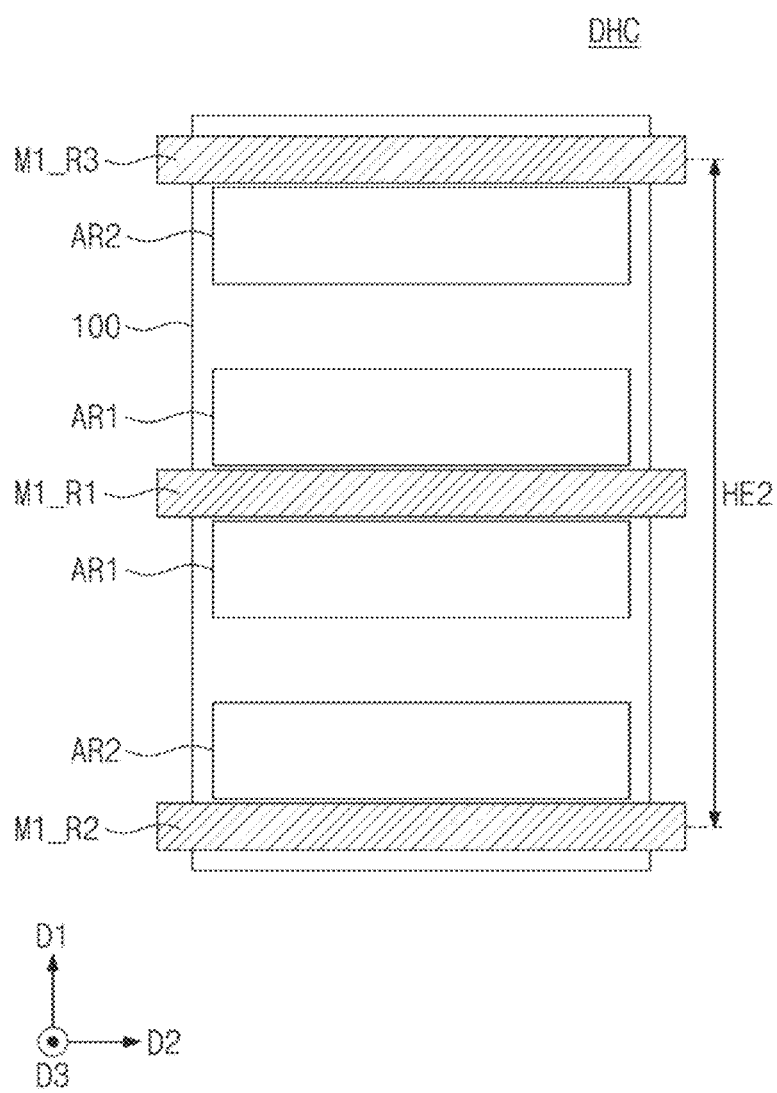
Figure 3:
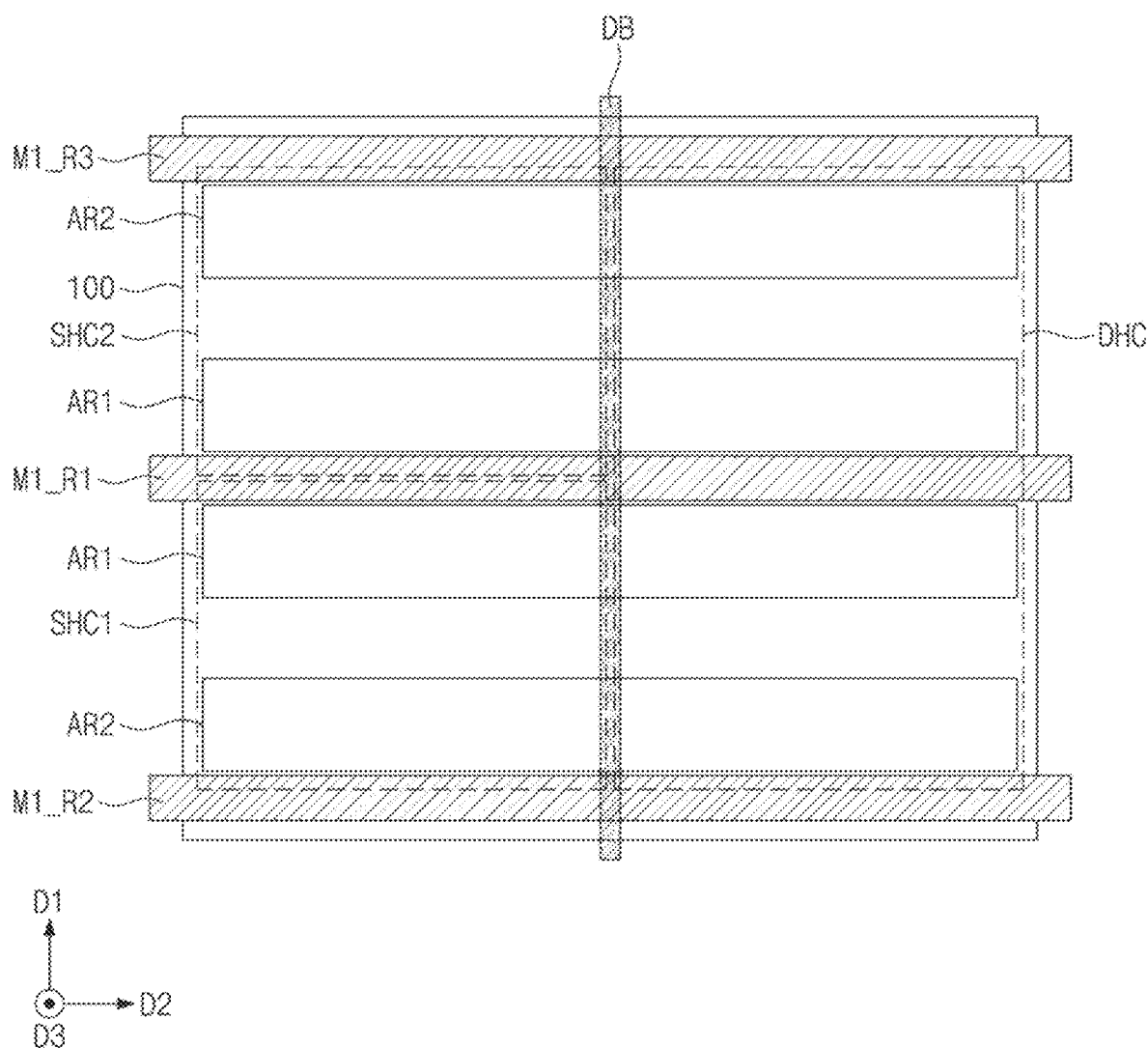

FIGS. 1, 2 and 3 are diagrams illustrating logic cells in a semiconductor device according to an embodiment.

Referring to FIG. 1, a single height cell SHC may be provided. A first power line M1_R1 and a second power line M1_R2 may be provided on a substrate 100. The first power line M1_R1 may be a conduction path, to which a source voltage VSS (e.g., a ground voltage) is provided. The second power line M1_R2 may be a conduction path, to which a drain voltage (VDD) (e.g., a power voltage) is provided.

The single height cell SHC may be defined between the first power line M1_R1 and the second power line M1_R2. The single height cell SHC may include one first active region AR1 and one second active region AR2. One of the first and second active regions AR1 and AR2 may be a p-type metal-oxide-semiconductor (PMOS) field-effect transistor (FET) (PMOSFET) region, and the other may be an n-type MOSFET (NMOSFET) region. In other words, the single height cell SHC may have a complimentary MOS (CMOS) structure provided between the first and second power lines M1_R1 and M1_R2. For example, the first active region AR1 may be an NMOSFET region, and the second active region AR2 may be a PMOSFET region.

Each of the first and second active regions AR1 and AR2 may have a first width W1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the disclosure, the logic cell may refer a logic device (e.g., AND, OR, XOR, XNOR, inverter, and so forth), which may be configured to execute a specific function. In other words, the logic cell may include transistors constituting the logic device and interconnection lines connecting transistors to each other.

Referring to FIG. 2, a double height cell DHC may be provided. A first power line M1_R1, a second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the source voltage (VSS) is provided.

The double height cell DHC may be defined between the second power line M1_R2 and the third power line M1_R3. The double height cell DHC may include a pair of first active regions AR1 and a pair of second active regions AR2.

One of the second active regions AR2 may be adjacent to the second power line M1_R2, and one of the second active regions AR2 may be adjacent to the third power line M1_R3. The pair of the first active regions AR1 may be adjacent to the first power line M1_R1. When viewed in a plan view, the first power line M1_R1 may be disposed between the pair of the first active regions AR1.

A length of the double height cell DHC in the first direction D1 may be defined as a second height HE2. The second height HE2 may be about two times the first height HE1 of FIG. 1. The pair of the first active regions AR1 of the double height cell DHC may be combined to serve as a single active region.

In an embodiment, the double height cell DHC shown in FIG. 2 may be defined as a multi-height cell. The multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 4:
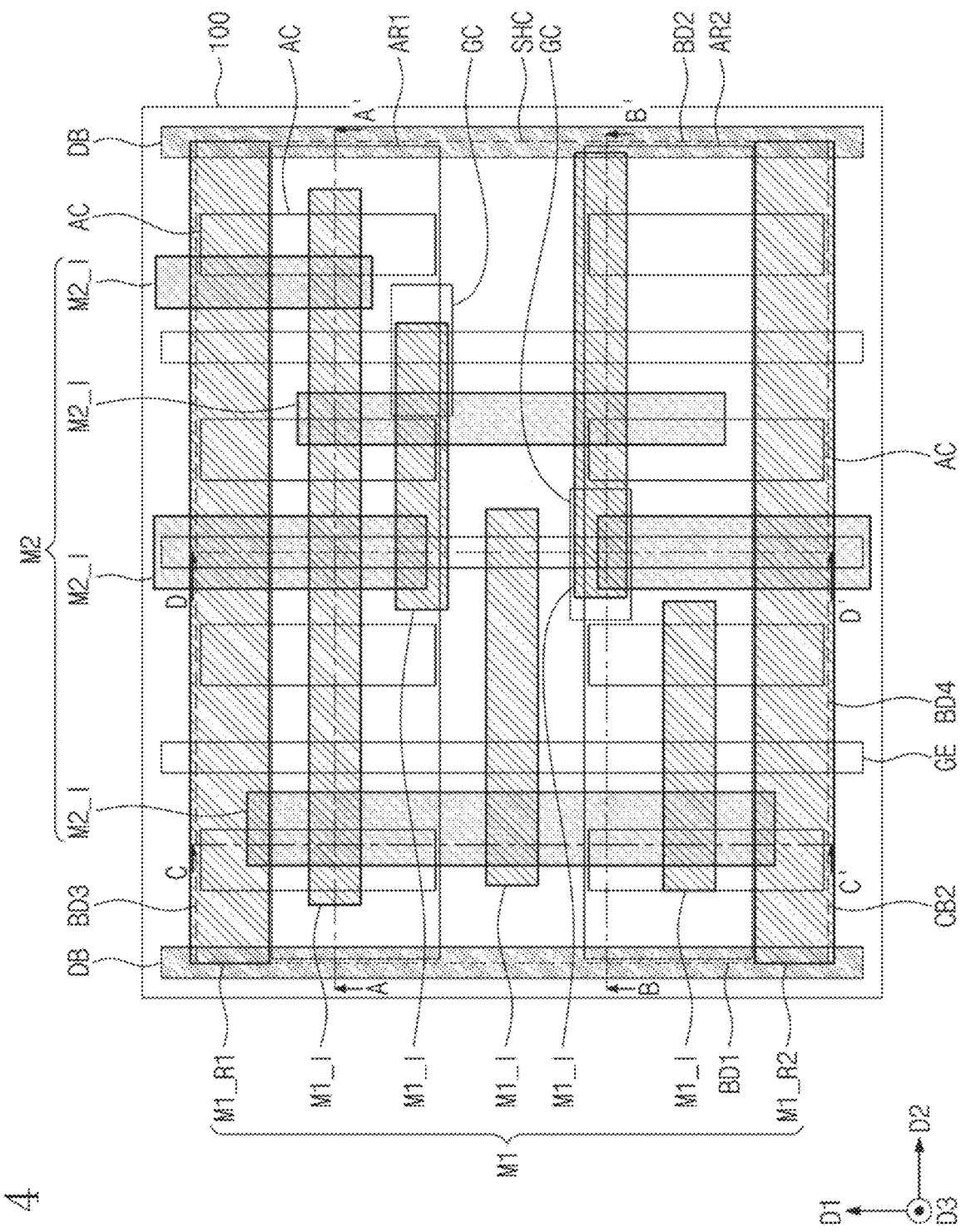
FIG. 4 is a diagram illustrating a semiconductor device according to an embodiment.
Figure 5A:
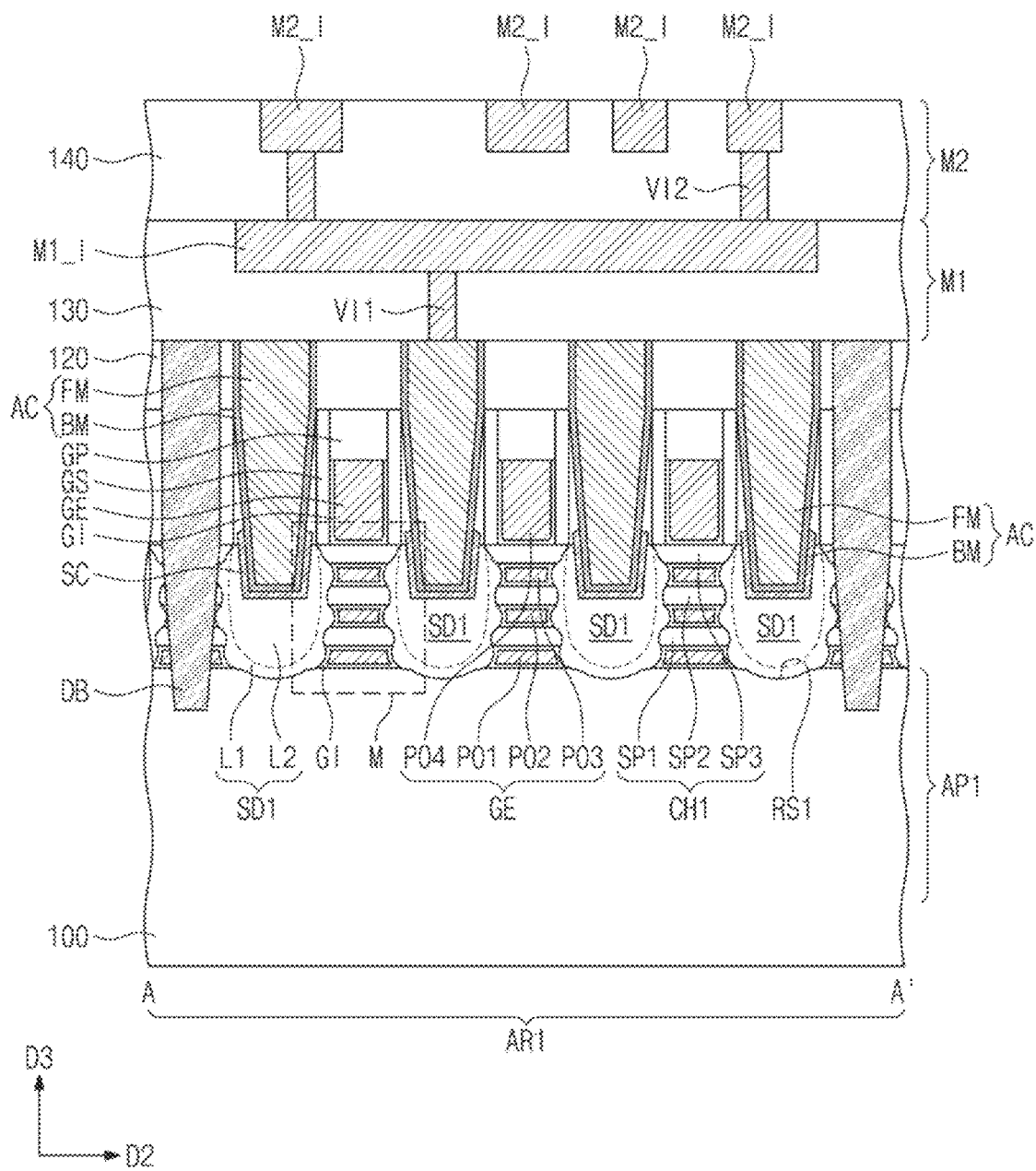
FIGS. 5A, 5B, 5C and 5D are cross-sectional views taken along lines A-A', B-B', C-C', and D-D', respectively, of FIG. 4 according to an embodiment.
Figure 5B:
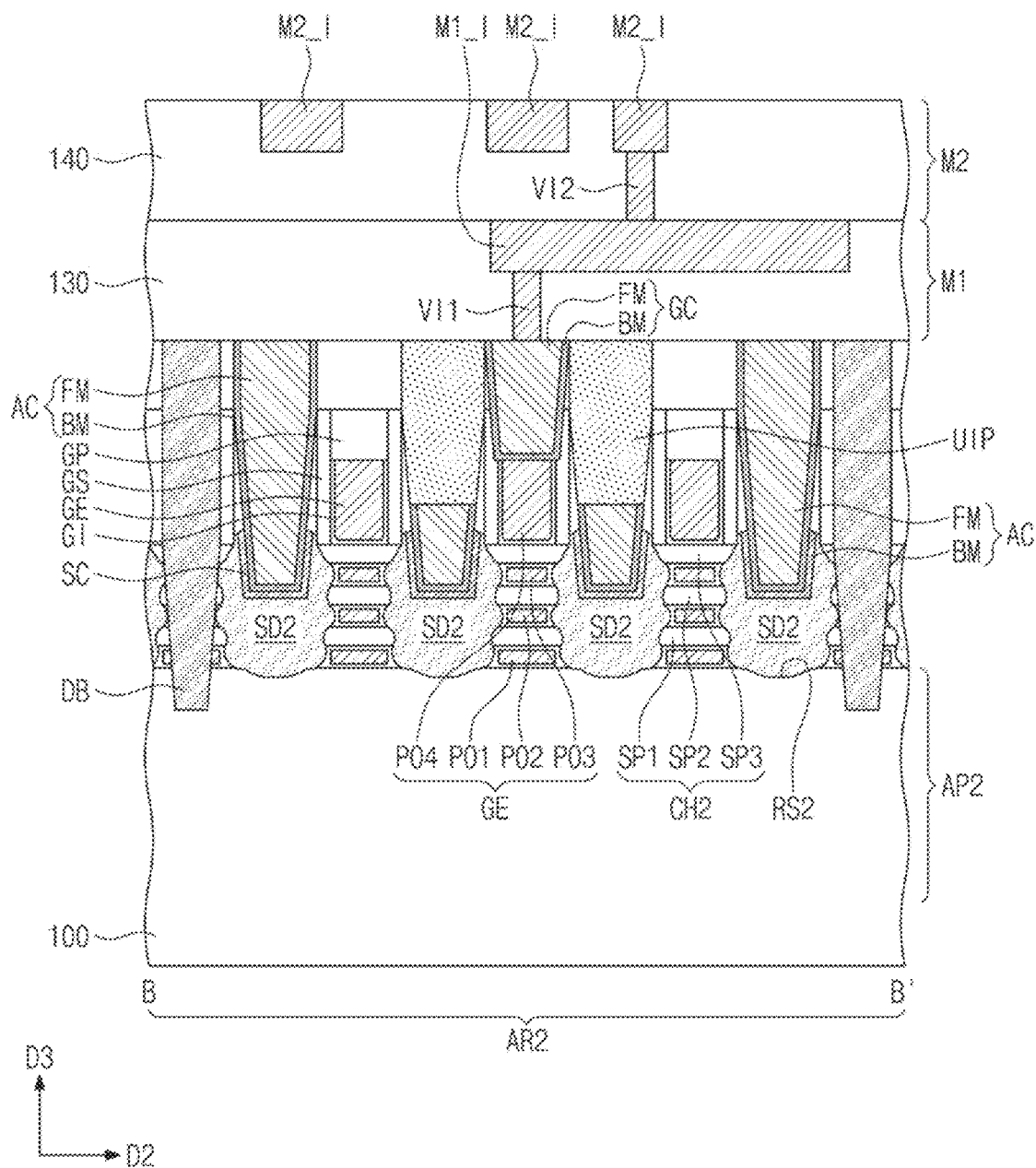
Figure 5C:
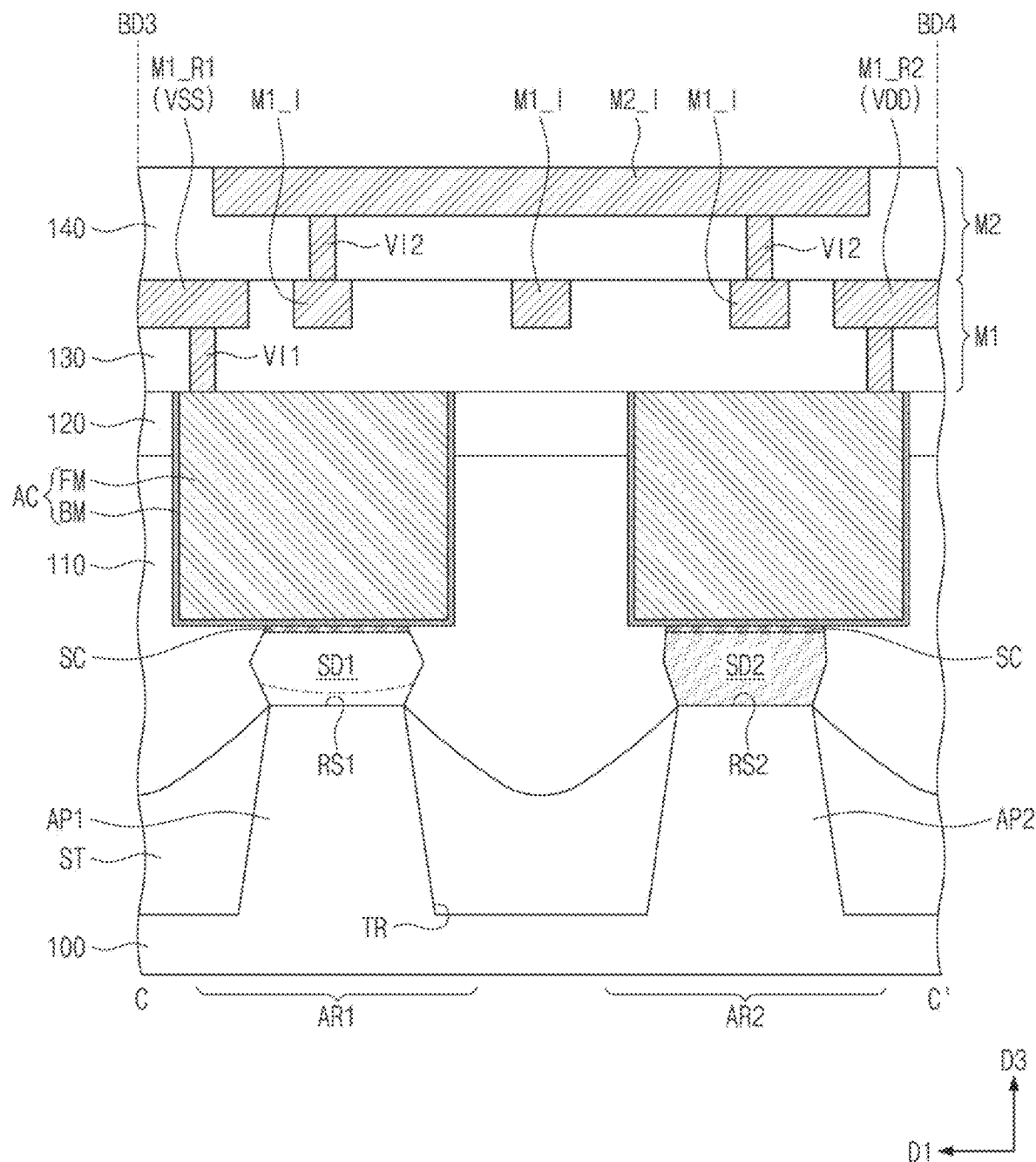

FIG. 4 is a diagram illustrating a semiconductor device according to an embodiment. FIGS. 5A, 5B, 5C and 5D are cross-sectional views taken along lines A-A', B-B', C-C', and D-D', respectively, of FIG. 4 according to an embodiment. FIG. 6 is a diagram illustrating a portion 'M' of FIG. 5A according to an embodiment. The semiconductor device of FIGS. 4 and 5A to 5D may be an example of the single height cell SHC of FIG. 1.

Referring to FIGS. 4 and 5A to 5D, the single height cell SHC may be provided on the substrate 100. Logic transistors constituting a logic circuit may be disposed on the single height cell SHC. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first active region AR1 and the second active region AR2. Each of the first and second active regions AR1 and AR2 may extend in the second direction D2. In an embodiment, the first active region AR1 may be an NMOSFET region, and the second active region AR2 may be a PMOSFET region.

A first active pattern AP1 and a second active pattern AP2 may be defined by a trench TR, which may be formed in an upper portion of the substrate 100. The first active pattern AP1 may be provided on the first active region AR1, and the second active pattern AP2 may be provided on the second active region AR2. The first and second active patterns AP1 and AP2 may extend in the second direction D2. Each of the first and second active patterns AP1 and AP2 may be a vertically-protruding portion of the substrate 100.

A device isolation layer ST may be provided on the substrate 100. The device isolation layer ST may fill the trench TR. The device isolation layer ST may include a silicon oxide layer. The device isolation layer ST may not cover first and second channel patterns CH1 and CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which may be sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon. In an embodiment, the first to third semiconductor patterns SP1, SP2, and SP3 may be a stack of nanosheets.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., n-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., p-type). The second channel pattern CH2 may be interposed between each pair of the second source/drain patterns SD2. In other words, each pair of the second source/drain patterns SD2 may be connected by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In an embodiment, a top surface of at least one of the first and second source/drain patterns SD1 and SD2 may be located at substantially the same level as the top surface of the third semiconductor pattern SP3.

In an embodiment, the first source/drain patterns SD1 may be formed of or include the same semiconductor material (e.g., Si) as the substrate 100. The second source/drain patterns SD2 may include a semiconductor material (e.g., SiGe) whose lattice constant is greater than the semiconductor material (e.g., Si) of the substrate 100. In this case, the pair of the second source/drain patterns SD2 may exert a compressive stress on the second channel pattern CH2 therebetween.

Each of the first source/drain patterns SD1 may include a first layer L1 and a second layer L2 on the first layer L1. Hereinafter, a sectional shape of the first source/drain pattern SD1 in the second direction D2 will be described in more detail with reference to FIG. 5A.

The first layer L1 may cover an inner surface of the first recess RS1. In an embodiment, a thickness of the first layer L1 may decrease in an upward direction. For example, a thickness of the first layer L1, which is measured in the third direction D3 at a bottom level of the first recess RS1, may be larger than a thickness of the first layer L1, which is measured in the second direction D2 at an upper level of the first recess RS1. In an embodiment, the thickness of the first layer L1 may be uniform, regardless of a height. The first layer L1 may have a U-shaped profile corresponding to the profile of the first recess RS1.

A side surface of the first layer L1 may have an uneven or embossing shape. In other words, the side surface of the first layer L1 may have a wavy profile. The side surface of the first layer L1 may be protruded toward respective inner electrodes IGE1-IGE3 of a gate electrode GE, which will be described below, and thus, may have a wavy profile. The side surface of the first layer L1 may include a side surface, which may protrude toward an inner gate insulating layer IIL to be described below, and a concave side surface, which contacts a plurality of semiconductor patterns SP1-SP3 to be described below.

The second layer L2 may fill the remaining portion of the first recess RS1. In an embodiment, a mean thickness of the first layer L1 may be smaller than a mean thickness of the second layer L2. A volume of the second layer L2 may be larger than a volume of the first layer L1. In other words, a ratio of a volume of the second layer L2 to a total volume of the first source/drain pattern SD1 may be greater than a ratio of a volume of the first layer L1 to the total volume of the first source/drain pattern SD1.

The first layer L1 may be formed of or include at least one of silicon-germanium (SiGe), silicon-germanium-carbon (SiGeC), and combinations thereof. A germanium concentration of the first layer L1 may range from about 5 at % (atomic percentage) to about 15 at %. The first source/drain pattern SD1 may be provided on the NMOSFET region, and the first layer L1 may be formed of or include silicon-germanium or silicon-germanium-carbon. The second layer L2 may be formed of or include the same semiconductor element (e.g., Si) as the substrate 100.

Each of the first and second layers L1 and L2 may include an impurity (e.g., phosphorus or arsenic) allowing the first source/drain pattern SD1 to have an n-type impurity. The impurity concentration in each of the first and second layers L1 and L2 may range from about $1.0 \times 10^{17}$ atom/cm$^3$ to about $5.0 \times 10^{22}$ atom/cm$^3$. The germanium concentration of the first layer L1 may be higher than the germanium concentration of the second layer L2. In addition, the germanium concentration of the first layer L1 may be higher than germanium concentrations of the semiconductor patterns SP1-SP3.

In an embodiment, the first layer L1 may be used to control a deposition rate of a gate insulating layer GI. The gate insulating layer GI may be deposited on side surfaces of the inner electrodes IGE1-IGE3 at a high deposition rate. A thickness of the gate insulating layer GI on the side surfaces of the inner electrodes IGE1-IGE3 may be larger than a thickness of the gate insulating layer GI on the top and bottom surfaces of the inner electrodes IGE1-IGE3. According to an embodiment of the disclosure, the gate insulating layer GI on the side surfaces of the inner electrodes IGE1-IGE3 may be formed to have a relatively large thickness, and in this case, the electric characteristics of the semiconductor device may be improved.

In an embodiment, the second source/drain pattern SD2 may have an uneven or embossing side surface. In other words, the side surface of the second source/drain pattern SD2 may have a wavy profile. The side surface of the second source/drain pattern SD2 may protrude toward first to third portions PO1, PO2, and PO3 of gate electrode GE to be described below.

Gate electrodes GE may be provided on the first and second channel patterns CH1 and CH2. Each of the gate electrodes GE may extend in the first direction D1 to cross the first and second channel patterns CH1 and CH2. Each of the gate electrodes GE may vertically overlap the first and second channel patterns CH1 and CH2. The gate electrodes GE may be arranged at a first pitch in the second direction D2.

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Figure 5D:
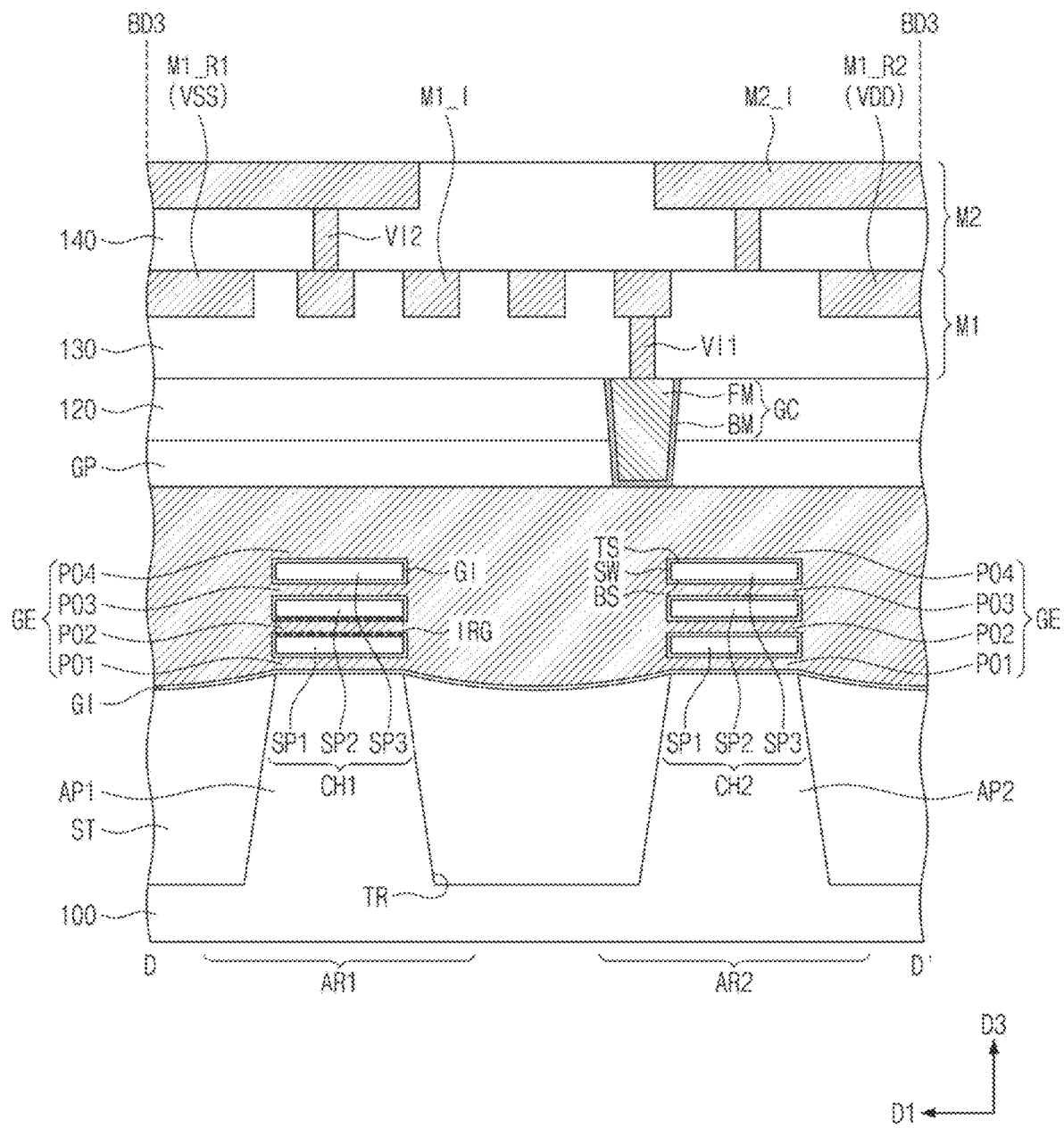
Figure 6:
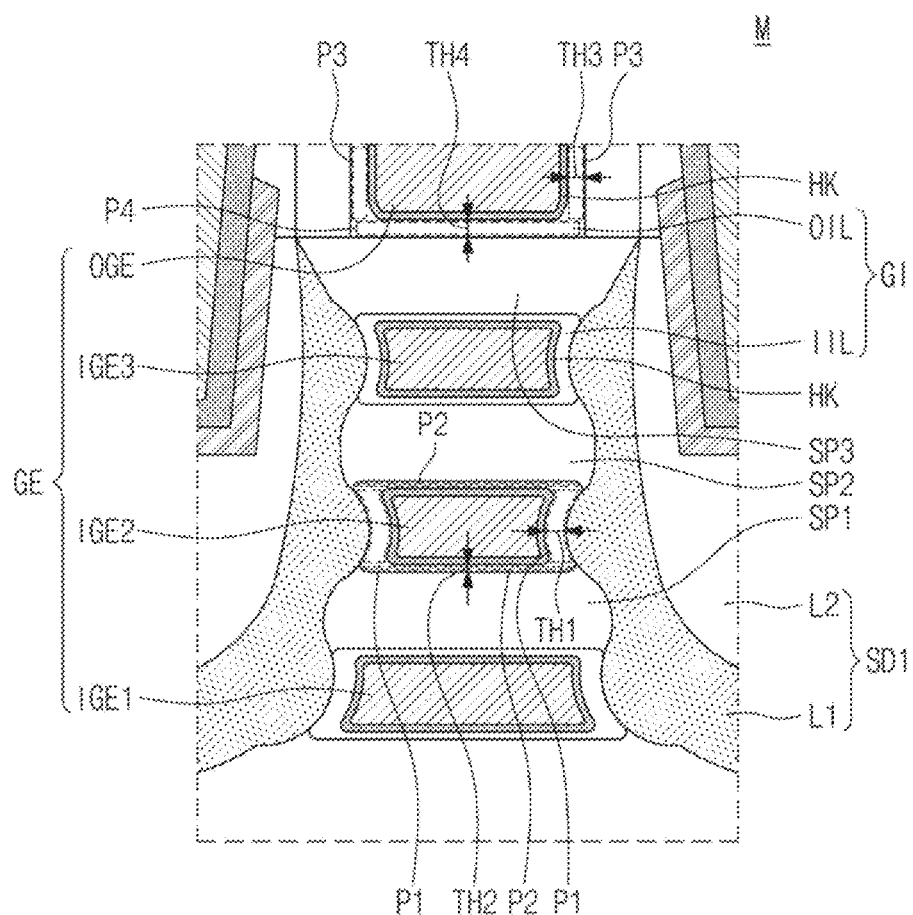
FIG. 6 is a diagram illustrating a portion 'M' of FIG. 5A according to an embodiment.

Referring to FIG. 5D, the gate electrode GE may be provided on a top surface TS, a bottom surface BS, and opposite side surfaces SW of each of the first to third semiconductor patterns SP1, SP2, and SP3. That is, the transistor according to an embodiment may be a three-dimensional field effect transistor (e.g., a multi-bridge-channel FET (MBCFET) or gate-all-around (GAAFET)) in which the gate electrode GE three-dimensionally surrounds the channel pattern.

On the first active region AR1, inner spacers may not be formed between the first to third portions PO1, PO2, and PO3 of the gate electrode GE and the first source/drain pattern SD1. Instead of forming inner spacers, the gate insulating layer GI may be thickly formed. Each of the first to third portions PO1, PO2, and PO3 of the gate electrode GE may be spaced apart from the first source/drain pattern SD1 with the gate insulating layer GI interposed therebetween. The gate insulating layer GI may prevent a leakage current from the gate electrode GE. The gate insulating layer GI according to an embodiment of the disclosure will be described in more detail with reference to FIG. 6.

Referring back to FIGS. 4 and 5A to 5D, a pair of gate spacers GS may be respectively disposed on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an embodiment, the gate spacers GS may be formed of or include at least one of SiCN, SiCON, or SiN. In an embodiment, the gate spacers GS may be a multi-layered structure, which may be formed of or may include at least two different materials including at least one of SiCN, SiCON, and SiN.

Referring back to FIGS. 4 and 5A to 5D, a gate capping pattern GP may be provided on the gate electrode GE. The gate capping pattern GP may extend along the gate electrode GE or in the first direction D1. The gate capping pattern GP may be formed of or include a material having an etch selectivity with respect to first and second interlayer insulating layers 110 and 120, which will be described below. The gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an embodiment, the gate insulating layer GI may include a silicon oxide layer or a silicon oxynitride layer. Referring to FIG. 6, a high-k dielectric layer HK may be interposed between the gate electrode GE and the gate insulating layer GI. The high-k dielectric layer HK of a uniform thickness may enclose the inner electrodes IGE1-IGE3 of the gate electrode GE. For example, the gate insulating layer GI may have a structure stacked on the high-k dielectric layer HK.

The high-k dielectric layer HK of FIG. 6 may be formed of or include a high-k dielectric material whose dielectric constant is higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In an embodiment, the gate insulating layer GI may have a structure, in which a silicon oxide layer and a high-k dielectric layer are stacked. In an embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which may be less than about 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and lead zirconium titanium oxide. The hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and yttrium (Y).

In the case where the dopants are aluminum (Al), a content of aluminum in the ferroelectric layer may range from about 3 at % to about 8 at %. The content of the dopants (e.g., aluminum atoms) may be a ratio of the number of aluminum atoms to the number of hafnium and aluminum atoms.

In the case where the dopants are silicon (Si), a content of silicon in the ferroelectric layer may range from about 2 at % to about 10 at %. In the case where the dopants are yttrium (Y), a content of yttrium in the ferroelectric layer may range from about 2 at % to about 10 at %. In the case where the dopants are gadolinium (Gd), a content of gadolinium in the ferroelectric layer may range from about 1 at % to about 7 at %. In the case where the dopants are zirconium (Zr), a content of zirconium in the ferroelectric layer may range from about 50 at % to about 80 at %.

The paraelectric layer may have the paraelectric property. The paraelectric layer may be formed of or include at least one of, for example, silicon oxide and high-k metal oxides. The metal oxides, which can be used as the paraelectric layer, may include at least one of, for example, hafnium oxide, zirconium oxide, and aluminum oxide, but the disclosure is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property when its thickness is in a specific range. In an embodiment, the ferroelectric layer may have a thickness ranging from about 0.5 nm to about 10 nm, but the disclosure is not limited as such. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

Referring back to FIGS. 4 and 5A to 5D, the gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, a transistor having a desired threshold voltage may be realized. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which may be stacked.

The second metal pattern may be formed of or include a metallic material whose resistance is lower than the first metal pattern. For example, the second metal pattern may be formed of or include at least one metallic material, which may include tungsten (W), aluminum (Al), titanium (Ti), and tantalum (Ta). The fourth portion PO4 of the gate electrode GE may include the first metal pattern and the second metal pattern on the first metal pattern.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

The single height cell SHC may have a first border BD1 and a second border BD2, which may be opposite to each other in the second direction D2. The first and second borders BD1 and BD2 may extend in the first direction D1.

The single height cell SHC may have a third border BD3 and a fourth border BD4, which may be opposite to each other in the first direction D1. The third and fourth borders BD3 and BD4 may extend in the second direction D2.

A pair of division structures DB, which may be opposite to each other in the second direction D2, may be provided at both sides of the single height cell SHC. For example, the pair of the division structures DB may be respectively provided on the first and second borders BD1 and BD2 of the single height cell SHC. The division structure DB may extend in the first direction D1 to be parallel to the gate electrodes GE. A pitch between the division structure DB and the gate electrode GE adjacent thereto may be equal to the first pitch.

The division structure DB may penetrate the first and second interlayer insulating layers 110 and 120 and may extend into the first and second active patterns AP1 and AP2. The division structure DB may penetrate an upper portion of each of the first and second active patterns AP1 and AP2. The division structure DB may electrically separate an active region of each of the single height cell SHC from an active region of a neighboring cell.

Active contacts AC may penetrate the first and second interlayer insulating layers 110 and 120 and may be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. The active contact AC may cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, and cobalt silicide.

Gate contacts GC may penetrate the second interlayer insulating layer 120 and the gate capping pattern GP and may be electrically connected to the gate electrodes GE, respectively. When viewed in a plan view, the gate contacts GC may be disposed to respectively overlap the first and second active regions AR1 and AR2. As an example, the gate contact GC may be provided on the second active pattern AP2 (e.g., see FIG. 5B).

In an embodiment, referring to FIG. 5B, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may at a level which is lower than a level of the bottom surface of the gate contact GC as a result of the upper portion of the active contact AC that is adjacent to the gate contact GC being filled with the upper insulating pattern UIP. Accordingly, the gate contact GC and the active contact AC, which are adjacent to each other, may be prevented from contacting each other and thereby to prevent a short circuit issue from occurring therebetween.

Each of the active and gate contacts AC and GC may include a conductive pattern FM and a bather pattern BM enclosing the conductive pattern FM. For example, the conductive pattern FM may be formed of or include at least one metallic material including aluminum, copper, tungsten, molybdenum, and cobalt. The barrier pattern BM may cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, and platinum. The metal nitride layer may be formed of or include at least one of titanium nitride (TiN), tantalum nitride (TaN), tungsten nitride (WN), nickel nitride (NiN), cobalt nitride (CoN), and platinum nitride (PtN).

A first metal layer M1 may be provided in the third interlayer insulating layer 130. For example, the first metal layer M1 may include the first power line M1_R1, the second power line M1_R2, and first interconnection lines M1_I. Each of the interconnection lines M1_R1, M1_R2, and M1_I of the first metal layer M1 may extend in the second direction D2 and parallel to each other.

The first and second power lines M1_R1 and M1_R2 may be respectively provided on the third and fourth borders BD3 and BD4 of the single height cell SHC. The first power line M1_R1 may be extended along the third border BD3 and in the second direction D2. The second power line M1_R2 may extend along the fourth border BD4 and in the second direction D2.

The first interconnection lines M1_I of the first metal layer M1 may be disposed between the first and second power lines M1_R1 and M1_R2. The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first and second power lines M1_R1 and M1_R2.

The first metal layer M1 may further include first vias VI1. The first vias VI1 may be respectively disposed below the interconnection lines M1_R1, M1_R2, and M1_I of the first metal layer M1. The active contact AC and the interconnection line of the first metal layer M1 may be electrically connected through the first via VI1. The gate contact GC and the interconnection line of the first metal layer M1 may be electrically connected rough the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to an embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may extend in the first direction D1 and may be parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one metallic material including aluminum, copper, tungsten, ruthenium, molybdenum, and cobalt. A plurality of metal layers (e.g., in addition to M1 and M2) may be additionally stacked on the fourth interlayer insulating layer 140. Each of the stacked metal layers may include interconnection lines, which are used as routing paths between cells.

FIG. 6 illustrates enlarged section view illustrating a portion 'M' of FIG. 5A. The gate electrode GE, the high-k dielectric layer HK, and the gate insulating layer GI will be described in more detail with reference to FIG. 6. The gate electrode GE may include a first inner electrode IGE1, a second inner electrode IGE2, a third inner electrode IGE3, and an outer electrode OGE. The first to third inner electrodes IGE1-IGE3 may correspond to the first to third portions PO1 to PO3, respectively, in the gate electrode GE described with reference to FIG. 5A. The outer electrode OGE may correspond to the fourth portion PO4 in the gate electrode GE of FIG. 5A.

The gate insulating layer GI may include a silicon oxide layer, a silicon oxynitride layer, or combinations thereof. The gate insulating layer GI may include an inner gate insulating layer IIL on the first to third inner electrodes IGE1-IGE3 and an outer gate insulating layer OIL on the outer electrode OGE. The outer gate insulating layer OIL may be provided on the outer electrode OGE. In other words, the outer gate insulating layer OIL may be provided on bottom and side surfaces of the outer electrode OGE and may be extended to the gate capping pattern GP (e.g., of FIG. 5A) covering a top surface of the outer electrode OGE.

The inner gate insulating layer IIL may be provided on the first to third inner electrodes IGE1-IGE3. For example, the inner gate insulating layer IIL may enclose the first to third inner electrodes IGE1-IGE3. Referring back to FIG. 6, the inner gate insulating layer IIL may include a first portion P1, which may be interposed between the second inner electrode IGE2 and the first layer L1 of the first source/drain pattern SD1, and a second portion P2, which may be interposed between the second inner electrode IGE2 and the semiconductor patterns SP1 and SP2 adjacent thereto. In addition, the inner gate insulating layer IIL, which may enclose the first and third inner electrodes IGE1 and IGE3, may also include the first portion P1 and the second portion P2.

The first portion P1 may be provided on a side surface of the second inner electrode IGE2, and the second portion P2 may be provided on top and bottom surfaces of the second inner electrode IGE2. Each of the first and second portions P1 and P2 may be formed to have a uniform thickness. Hereinafter, the thickness of the first portion P1 will be referred to as a first thickness TH1, and the thickness of the second portion P2 will be referred to as a second thickness TH2. In an embodiment, the first thickness TH1 may range from about 8.0 Å to about 12.0 Å. The second thickness TH2 may range from about 11.0 Å to about 16.0 Å. In an embodiment, the first thickness TH1 may be larger than the second thickness TH2. For example, the first thickness TH1 may be about 1.3 times to about 3.0 times the second thickness TH2.

In the case where the first thickness TH1 of the first portion P1 is larger than the second thickness TH2 of the second portion P2, the inner gate insulating layer IIL may be used in place of the inner spacer, on the NMOSFET region. Thus, a distance between the inner electrodes IGE1-IGE3 and the first source/drain pattern SD1 may be increased. That is, a capacitor/gate leakage current may be reduced without the inner spacer. According to an embodiment of the disclosure, by providing the gate insulating layer GI having the first thickness TH1 of a large value, electrical and reliability characteristics of the semiconductor device may be improved.

Furthermore, according to an embodiment of the disclosure, an etching process of forming an indent region and a deposition process of forming a SiN-containing inner spacer may be omitted. In this case, it an over-growth issue of the first source/drain pattern SD1 in the process of forming the first source/drain pattern SD1 may be prevented and thereby uniformity of the first source/drain pattern SD1 may be improved. In addition, the first and second portions P1 and P2 of the inner gate insulating layer IIL may include a silicon oxide layer, which may be formed through a growth process. Thus, charges may be prevented from being trapped at interfaces between the inner gate insulating layer IIL and the first source/drain pattern SD1. Charges may also be prevented from being trapped at interfaces between the semiconductor patterns SP1-SP3 and the inner gate insulating layer IIL. That is, according to embodiments of the disclosure, the inner gate insulating layer IIL may be formed without performing an additional process, and thus, it efficiency in the fabrication process may be increase and electrical and reliability characteristics of the semiconductor device may be improved.

The high-k dielectric layer HK may be interposed between the inner electrodes IGE1-IGE3 and the inner gate insulating layer IIL. In other words, the high-k dielectric layer HK may be provided on the inner electrodes IGE1-IGE3, and the inner gate insulating layer IIL may be provided on the high-k dielectric layer HK. The high-k dielectric layer HK may enclose the inner electrodes IGE1-IGE3. The high-k dielectric layer HK may be formed to have a uniform thickness.

Referring back to FIG. 6, the first portion P1 may include a first side surface, which contacts the first layer L1 of the first source/drain pattern SD1. The high-k dielectric layer HK may include a second side surface, which contacts the first portion P1. The second inner electrode IGE2 may include a third side surface, which contact the high-k dielectric layer HK. Each of the first to third side surfaces may include a concave portion. Each of the first to third side surfaces may include protruding portions, which are protruded toward the first layer L1. The concave portion may be interposed between the protruding portions and may have a concave shape that is concavely recessed toward the second inner electrode IGE2. Each of the concave and protruding portions may have a curved shape. In other words, each of the first to third side surfaces may have a wavy profile.

As described above, each of the first and second portions P1 and P2 may be formed to have a uniform thickness, and the high-k dielectric layer HK may be formed to have a uniform thickness. Thus, a distance between the first and second side surfaces may be uniform, and a distance between the second and third side surfaces may be uniform. The distance between the first and second side surfaces may have a value corresponding to the first thickness TH1.

The outer gate insulating layer OIL may include a third portion P3, which may be interposed between the outer electrode OGE and the gate spacer GS, and a fourth portion P4, which may be interposed between the outer electrode OGE and the uppermost one of the semiconductor patterns (e.g., the third semiconductor pattern SP3). The third portion P3 may be provided on a side surface of the outer electrode OGE, and the fourth portion P4 may be provided on a bottom surface of the outer electrode OGE. Each of the third and fourth portions P3 and P4 may be formed to have a substantially uniform thickness. The third portion P3 may have a third thickness TH3, and the fourth portion P4 may have a fourth thickness TH4. In an embodiment, the third thickness TH3 may be substantially equal to the fourth thickness TH4.

FIGS. 7A, 7B, 8A, 8B, 9A, 9B, 9C, 10A, 10B, 10C, 11A, 11B, 11C, 11D, 12A, 12B, 12C, and 12D are cross-sectional views illustrating a method of fabricating a semiconductor device, according to an embodiment. FIGS. 7A, 8A, 9A, 10A, 11A, and 12A are cross-sectional views corresponding to the line A-A' of FIG. 4. FIGS. 9B, 10B, 11B, and 12B are cross-sectional views corresponding to the line B-B' of FIG. 4. FIGS. 9C, 10C, 11C, and 12C are cross-sectional views corresponding to the line C-C' of FIG. 4. FIGS. 7B, 8B, 11D, and 12D are cross-sectional views corresponding to the line D-D' of FIG. 4.

Figure 7A:
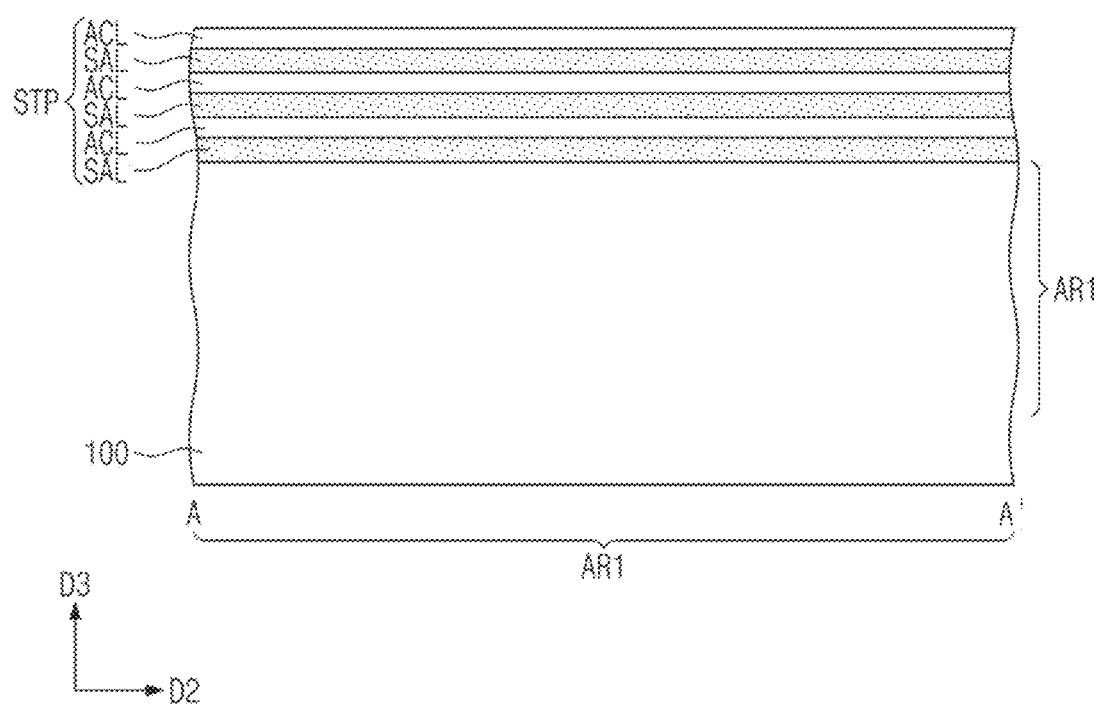
FIGS. 7A, 7B, 8A, 8B, 9A, 9B, 9C, 10A, 10B, 10C, 11A, 11B, 11C, 11D, 12A, 12B, 12C, and 12D are cross-sectional views illustrating a method of fabricating a semiconductor device, according to an embodiment.
Figure 7B:
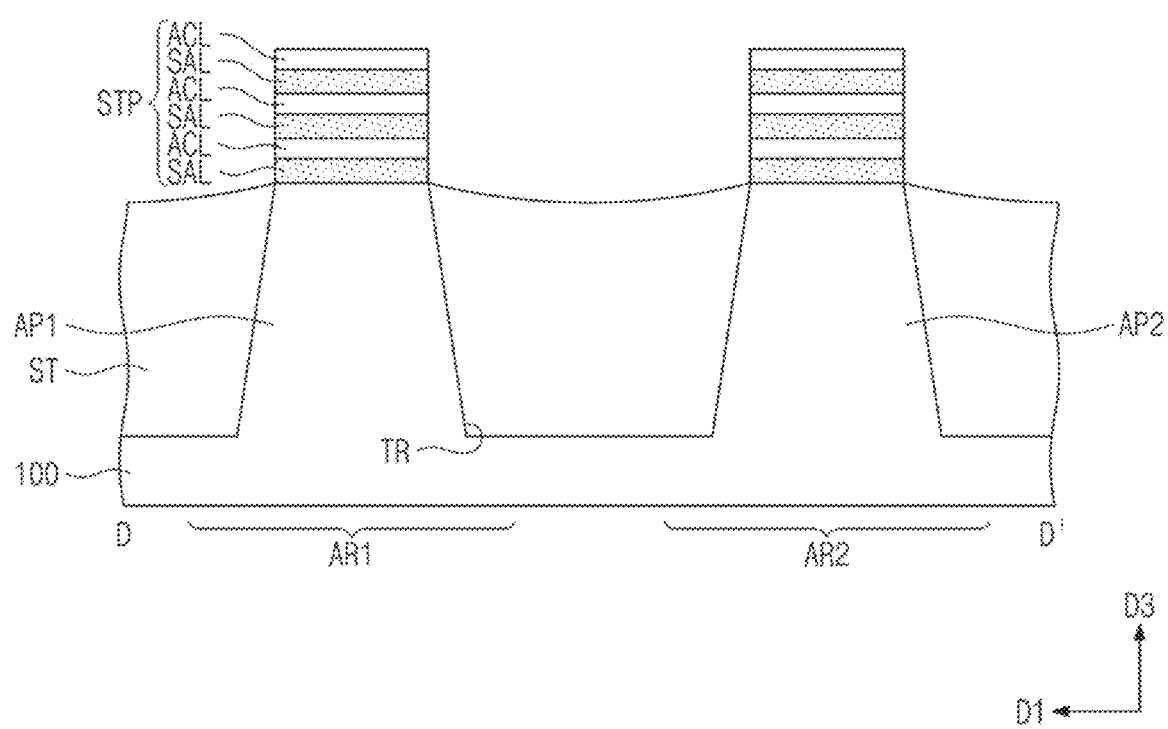

Referring to FIGS. 7A and 7B, the substrate 100 including the first and second active regions AR1 and AR2 may be provided. Active layers ACL and sacrificial layers SAL may be alternately stacked on the substrate 100. The active layers ACL may be formed of or include at least one of silicon (Si), germanium (Ge), and silicon germanium (SiGe), and the sacrificial layers SAL may be formed of or include another one of silicon (Si), germanium (Ge), and silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may range from about 10 at % to about 30 at %.

Mask patterns may be respectively formed on the first and second active regions AR1 and AR2 of the substrate 100. The mask pattern may be a line-shaped pattern or bar-shaped pattern that extends in the second direction D2.

A patterning process using the mask patterns as an etch mask may be performed to form the trench TR defining the first and second active patterns AP1 and AP2. The first active pattern AP1 may be formed on the first active region AR1. The second active pattern AP2 may be formed on the second active region AR2.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. An insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed at a level higher than the device isolation layer ST and may be exposed to the outside of the device isolation layer ST. In other words, the stacking patterns STP may protrude vertically above the device isolation layer ST.

Figure 8A:
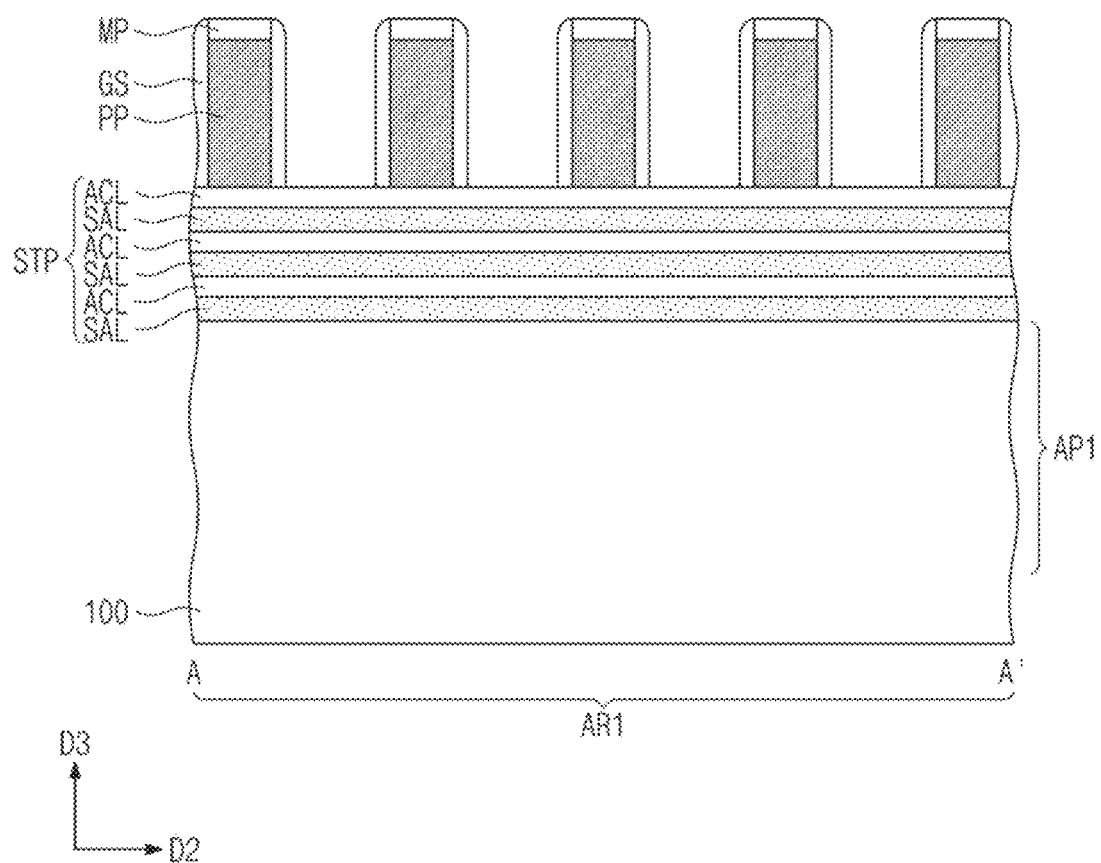
Figure 8B:
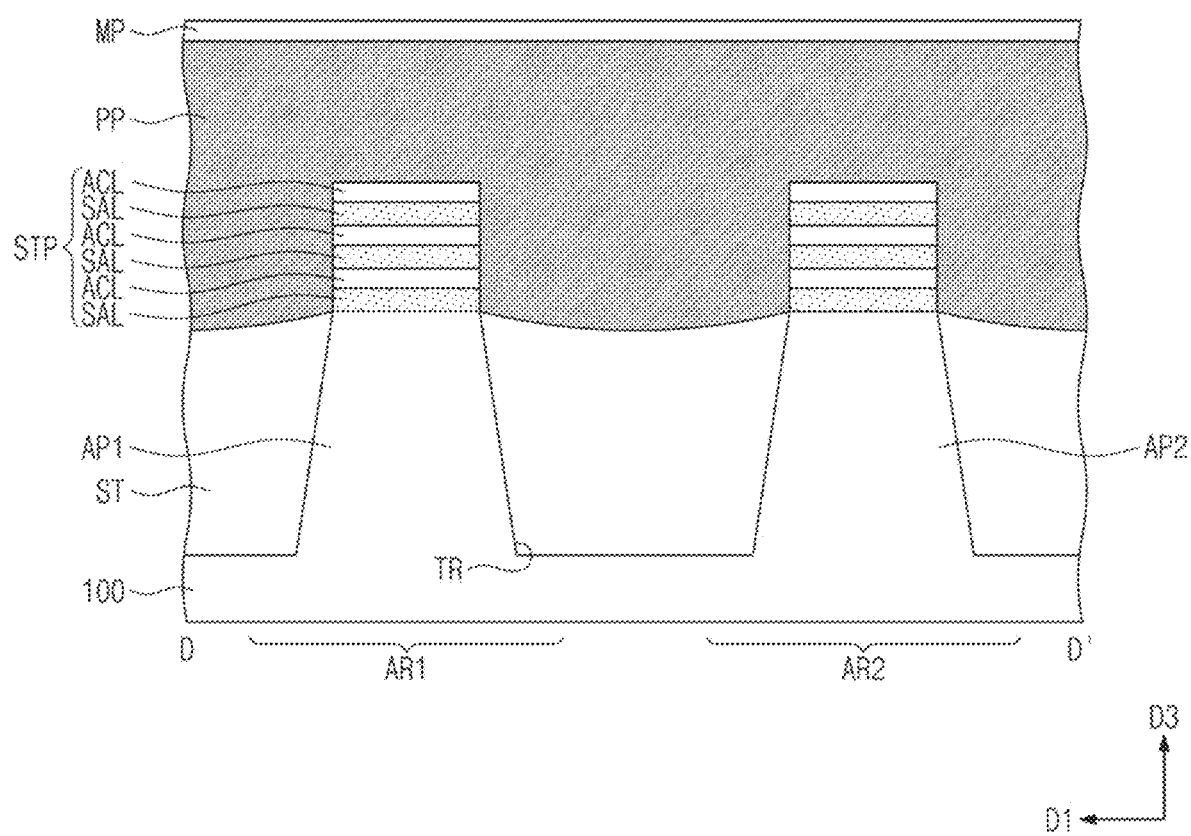

Referring to FIGS. 8A and 8B, sacrificial patterns PP may be formed on the substrate 100 to cross the stacking patterns STP. Each of the sacrificial patterns PP may be a line- or bar-shaped pattern that is extended in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In an embodiment, the gate spacer GS may be a multi-layered structure including at least two layers.

Figure 9A:
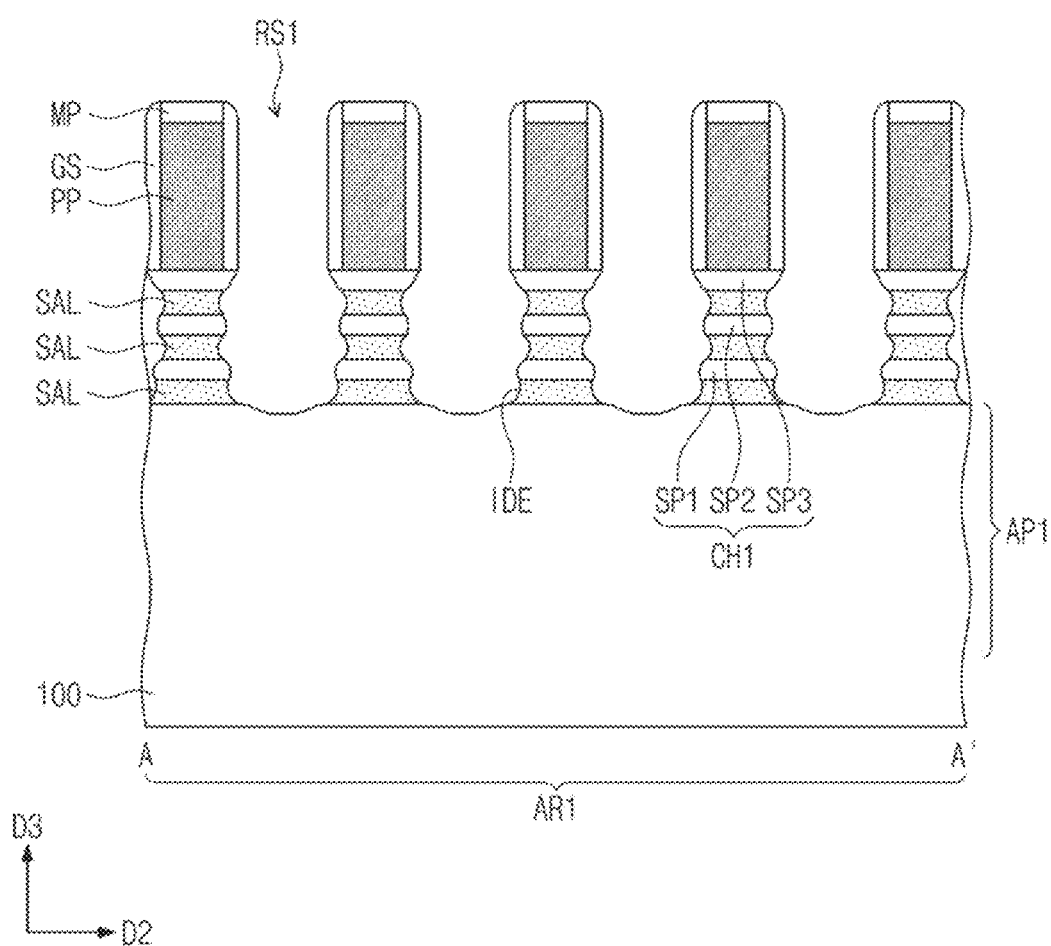
Figure 9B:
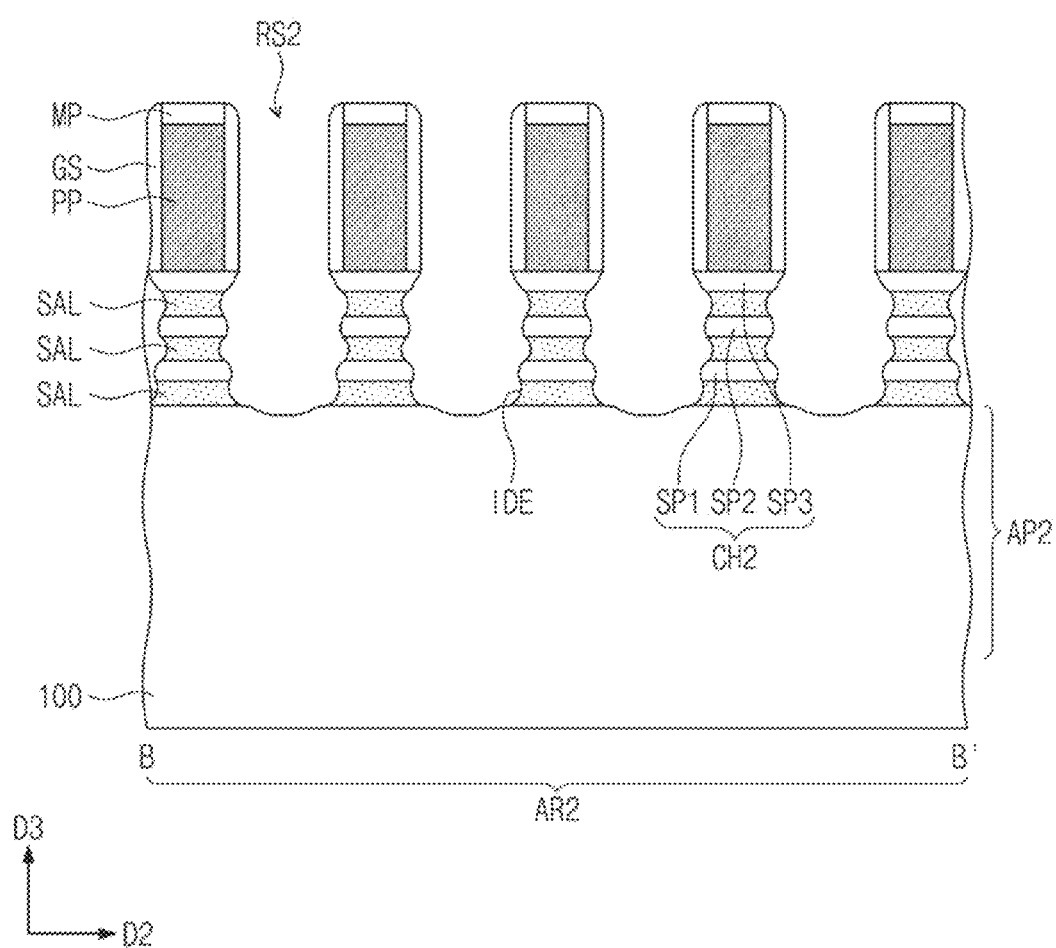
Figure 9C:
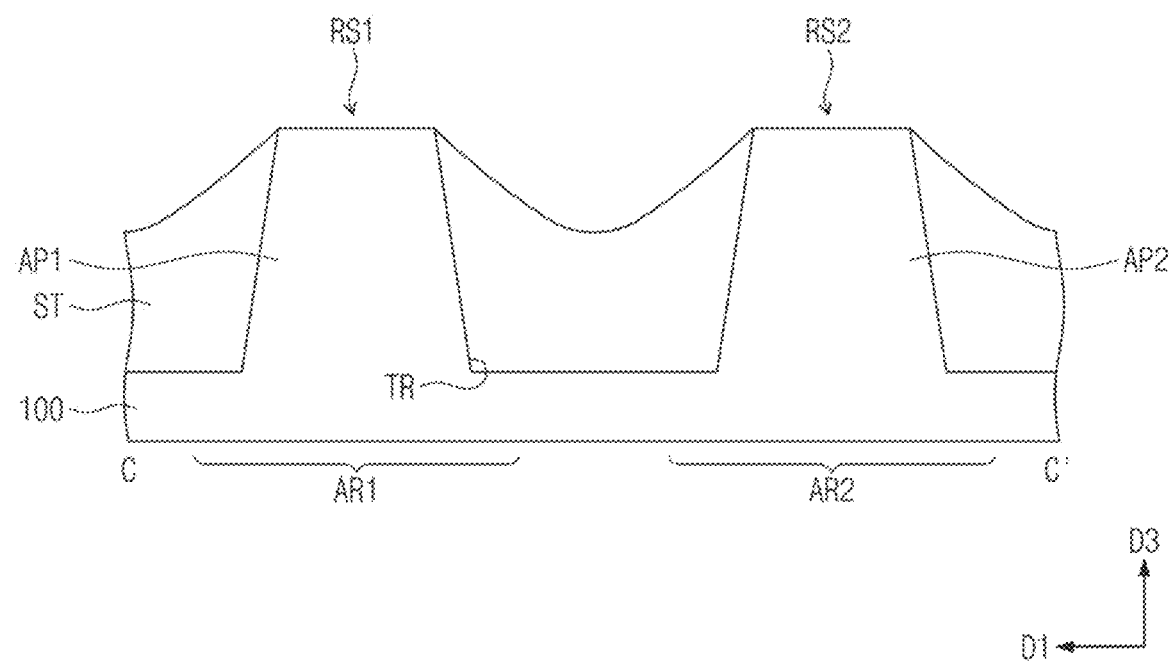

Referring to FIGS. 9A to 9C, the first recesses RS1 may be formed in the stacking pattern STP on the first active pattern AP1. The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 9C).

The first recesses RS1 may be formed by etching the stacking pattern STP, which may be formed on the first active pattern AP1, using the hard mask patterns MP and the gate spacers GS as an etch mask. The first recess RS1 may be formed between a pair of the sacrificial patterns PP. A selective etching process may be performed on the sacrificial layers SAL exposed by the first recess RS1 to form indent regions IDE on the first active pattern AP1. Due to the presence of the indent regions IDE, an inner side surface of the first recess RS1 may have a wavy profile.

The first to third semiconductor patterns SP1, SP2, and SP3, which may be sequentially stacked between adjacent recesses of the first recesses RS1, may be respectively formed from the active layers ACL. The first to third semiconductor patterns SP1, SP2, and SP3 between the adjacent recesses of the first recesses RS1 may constitute the first channel pattern CH1.

Referring back to FIGS. 9A to 9C, the second recesses RS2 in the stacking pattern STP on the second active pattern AP2 may be formed by a method that is similar to that for the first recesses RS1. A selective etching process may be performed on the sacrificial layers SAL, which may be exposed by the second recess RS2, to form the indent regions IDE on the second active pattern AP2. Due to the indent regions IDE, the second recess RS2 may have a wavy inner side surface. The first to third semiconductor patterns SP1, SP2, and SP3 between adjacent recesses of the second recesses RS2 may constitute the second channel pattern CH2.

Figure 10A:
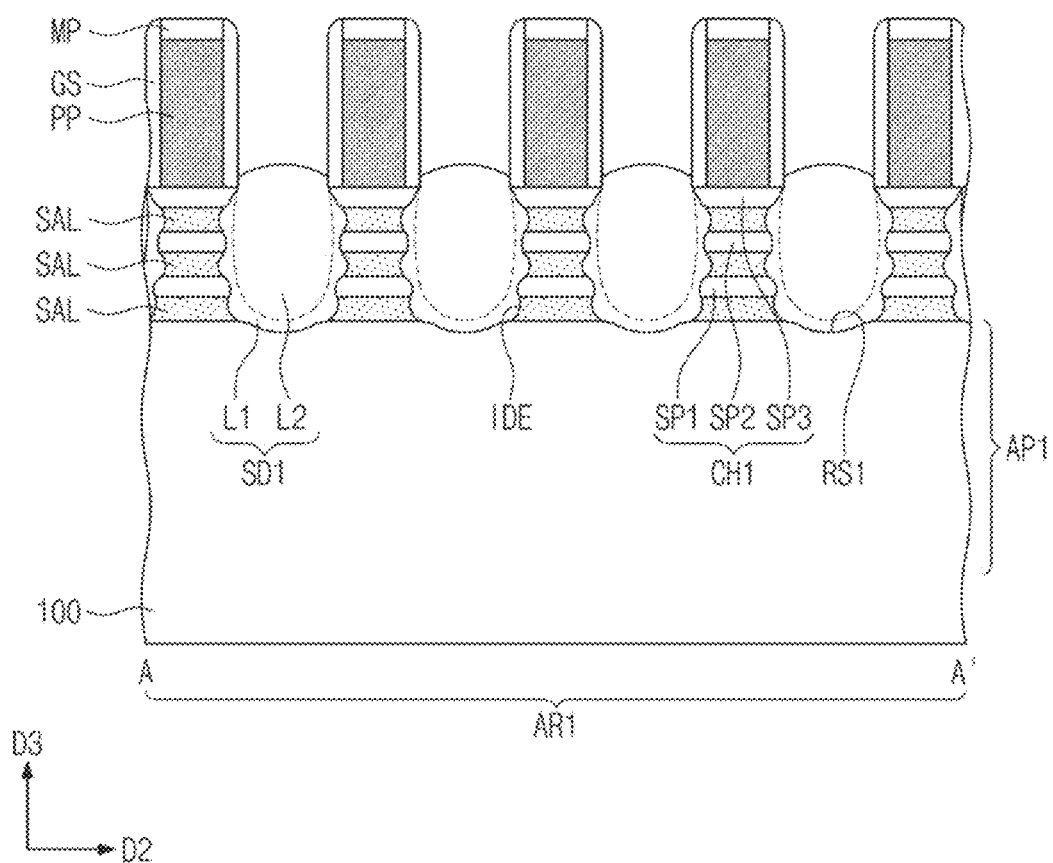
Figure 10B:
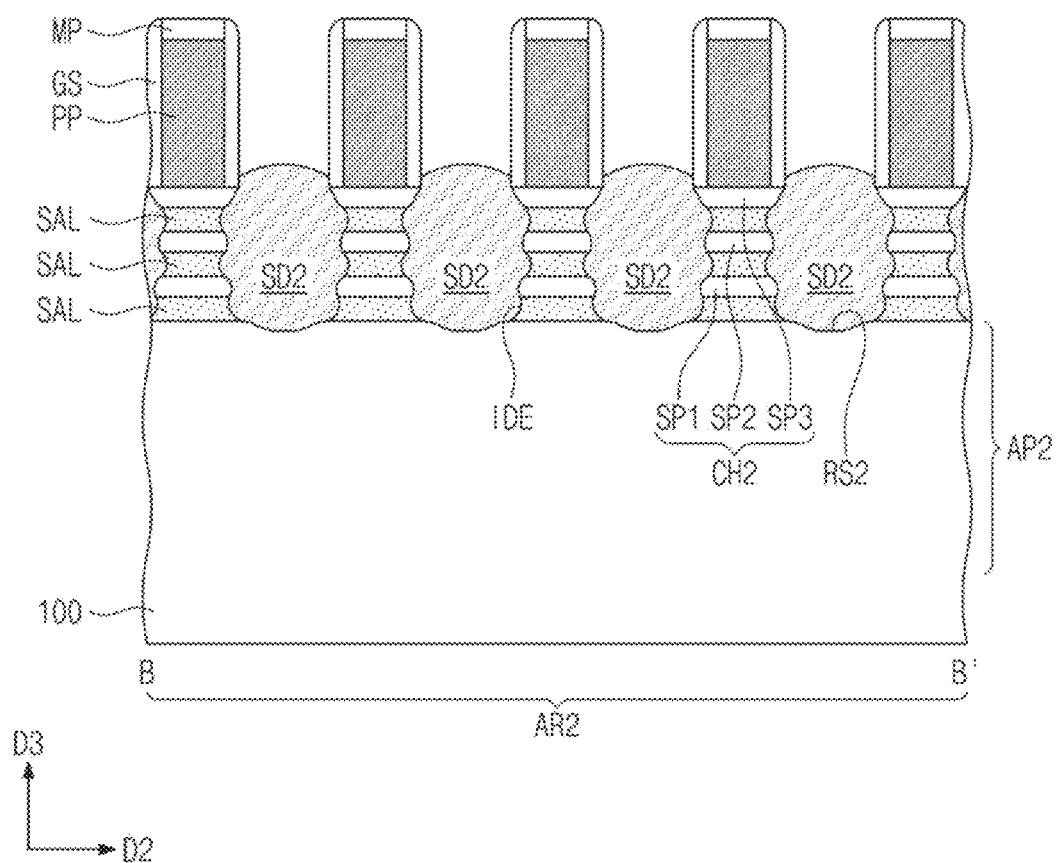
Figure 10C:
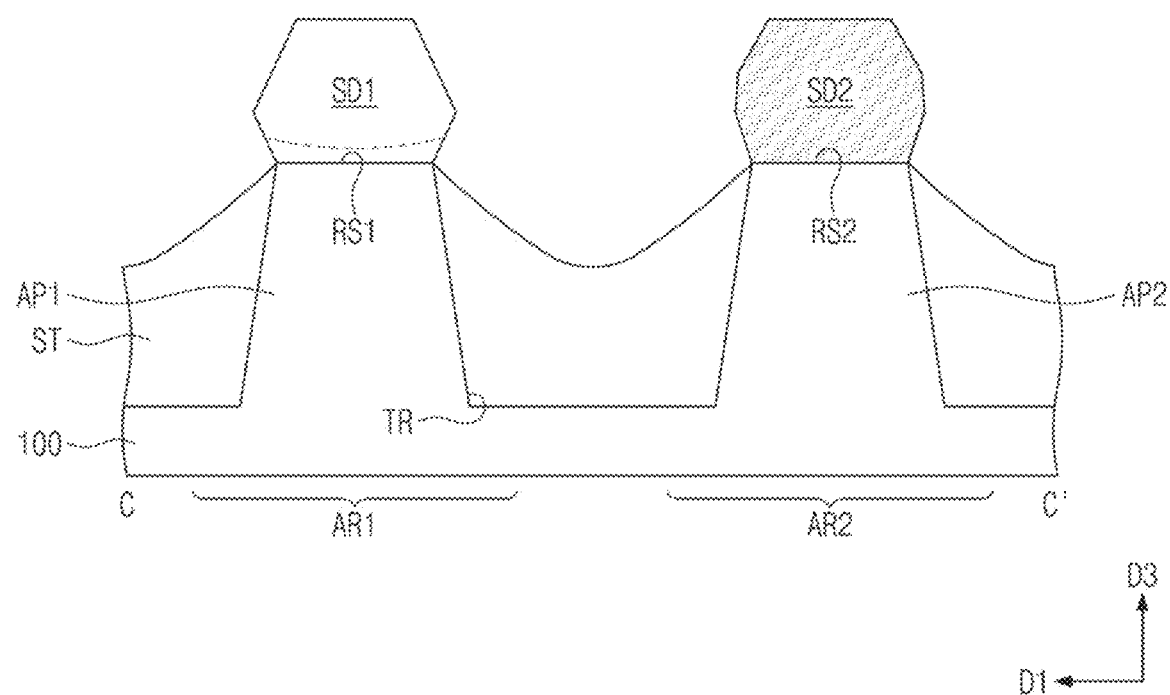

Referring to FIGS. 10A to 10C, the first source/drain patterns SD1 may be formed in the first recesses RS1, respectively. An SEG process, in which an inner surface of the first recess RS1 is used as a seed layer, may be performed to form an epitaxial layer filling the first recess RS1. The epitaxial layer may be grown using the first to third semiconductor patterns SP1, SP2, and SP3 and the substrate 100, which may be exposed by the first recess RS1, as the seed layer. In an embodiment, the SEG process may include a chemical vapor deposition (CVD) process or a molecular beam epitaxy (MBE) process.

More specifically, a first SEG process may be performed using the first to third semiconductor patterns SP1-SP3 and the first active pattern APE which may be exposed through the first recess RS1, as a seed layer. As a result, the first layer L1 may be grown in the first recess RS1. In an embodiment, arsenic (As) atoms may be injected into the first layer L1 in an in-situ manner when the first layer L1 is grown.

A thickness of the first layer L1, which may be grown from a bottom of the first recess RS1, may be larger than a thickness of the first layer L1, which may be grown from the semiconductor pattern SP1-SP3. This may be due to a growth rate of the first layer L1 being higher in a vertical direction (i.e., the third direction D3) than in a horizontal direction.

In the present embodiment, the first layer L1 may be continuously formed in the first recess RS1. For example, the first layer L1 may be continuously grown from the bottom of the first recess RS1 to the third semiconductor pattern SP3 without any discontinuous structure. The first layer L1 may be formed to cover not only the first to third semiconductor patterns SP1-SP3 but also the sacrificial layers SAL.

A second SEG process may be performed using the first layer L1 in the first recess RS1 as a seed layer. As a result, the second layer L2 may be formed to fill the first recess RS1. The second SEG process may be performed until the first recess RS1 is fully filled with the second layer L2. In an embodiment, arsenic (As) atoms may be injected into the second layer L2 in an in-situ manner when the second layer L2 is grown.

In an embodiment, the first layer L1 may be formed of or include at least one of silicon-germanium (SiGe), silicon-germanium-carbon (SiGeC), and combinations thereof. The first layer L1 may be formed to have a germanium concentration ranging from about 5 at % to about 15 at %. The second layer L2 may be formed of or include the same semiconductor element (e.g., Si) as the substrate 100.

During the formation of the first and second layers L1 and L2, the first and second layers L1 and L2 may be doped with impurities (e.g., phosphorus, arsenic, or antimony) in an in-situ manner to have an n-type impurity. In an embodiment, after the formation of the first layer L1, impurities may be injected into the first layer L1, and after the formation of the second layer L2, impurities may be injected into the second layer L2.

The second source/drain patterns SD2 may be formed in the second recesses RS2, respectively. The second source/drain pattern SD2 may be formed by a SEG process using an inner surface of the second recess RS2 as a seed layer.

In an embodiment, the second source/drain pattern SD2 may be formed of or include a semiconductor material (e.g., SiGe) whose lattice constant is greater than that of a semiconductor material of the substrate 100. During the formation of the second source/drain pattern SD2, the second source/drain pattern SD2 may be doped in-situ with p-type impurities (e.g., boron, gallium, or indium). Alternatively, impurities may be injected into the second source/drain pattern SD2, after the formation of the second source/drain pattern SD2.

Referring to FIGS. 11A to 11D, the first interlayer insulating layer 110 may be formed to cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

The exposed sacrificial patterns PP may be selectively removed. As a result of the removal of the sacrificial patterns PP, an outer region ORG exposing the first and second channel patterns CH1 and CH2 may be formed (e.g., see FIG. 11D). The removal of the sacrificial patterns PP may include a wet etching process which may be performed using an etching solution capable of selectively etching polysilicon.

Figure 11A:
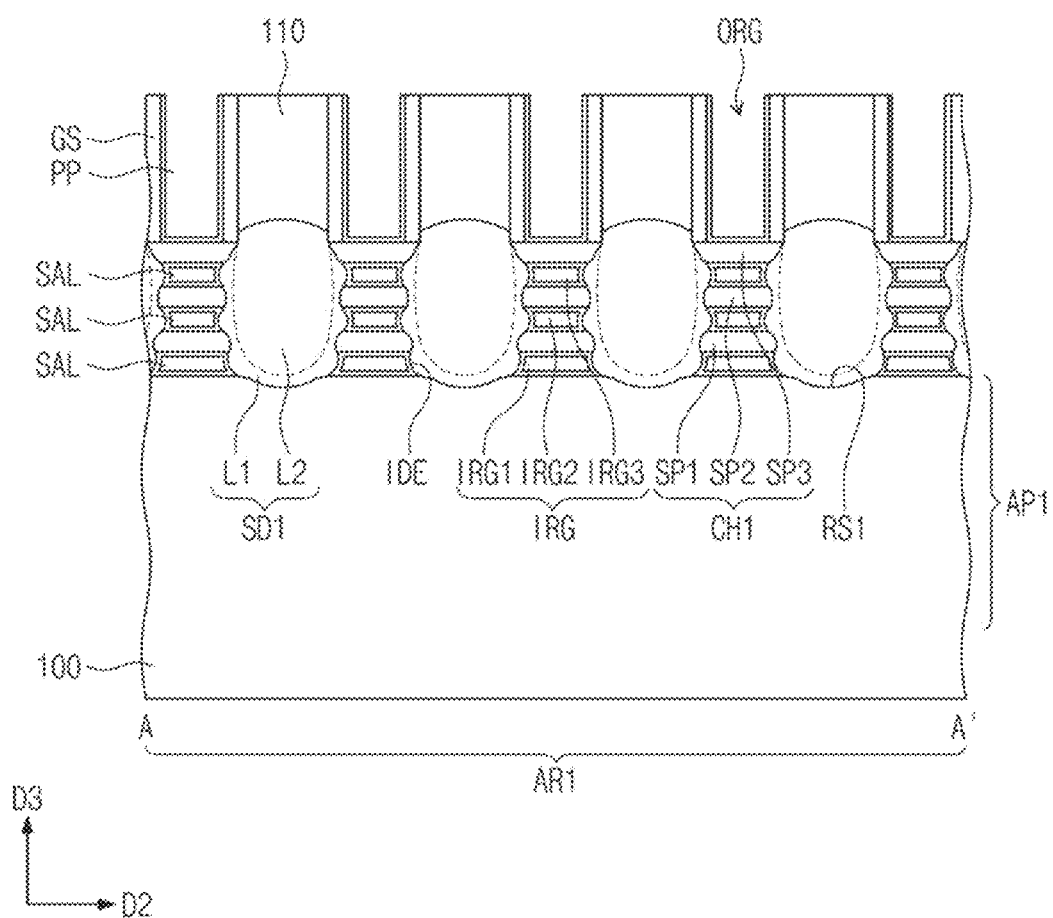
Figure 11B:
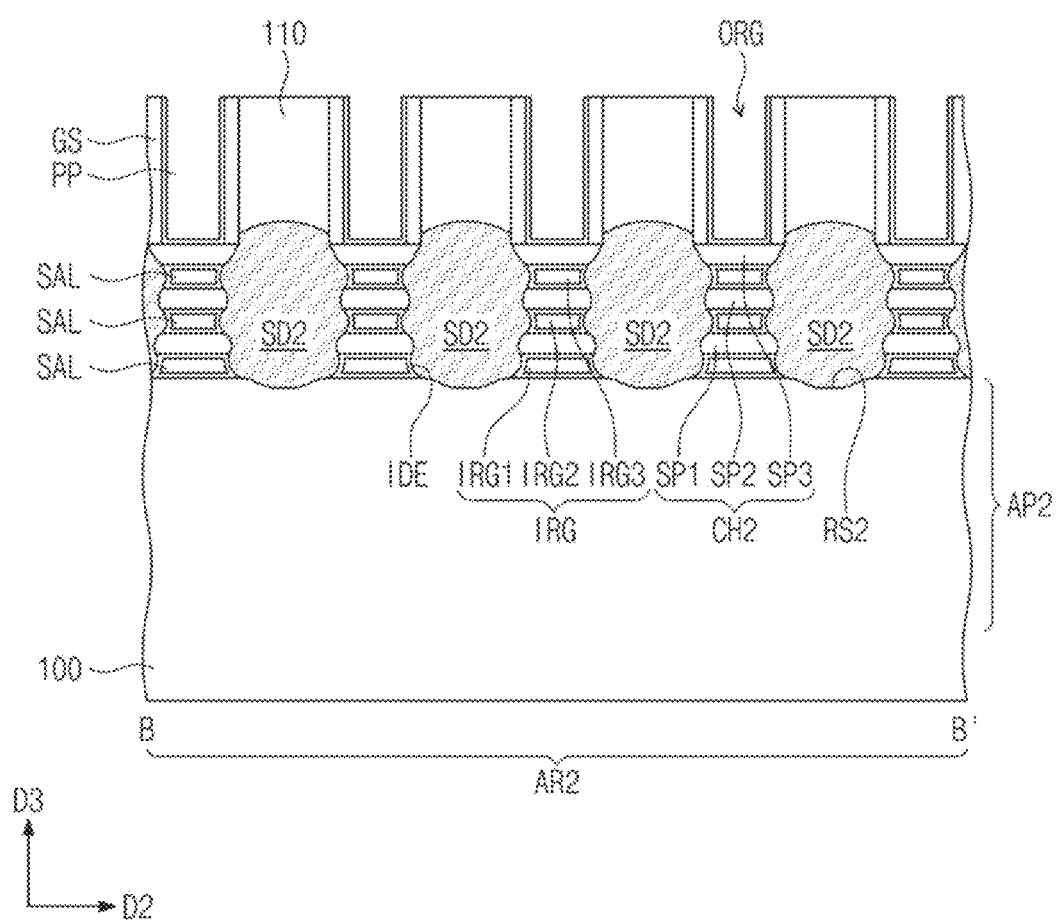
Figure 11C:
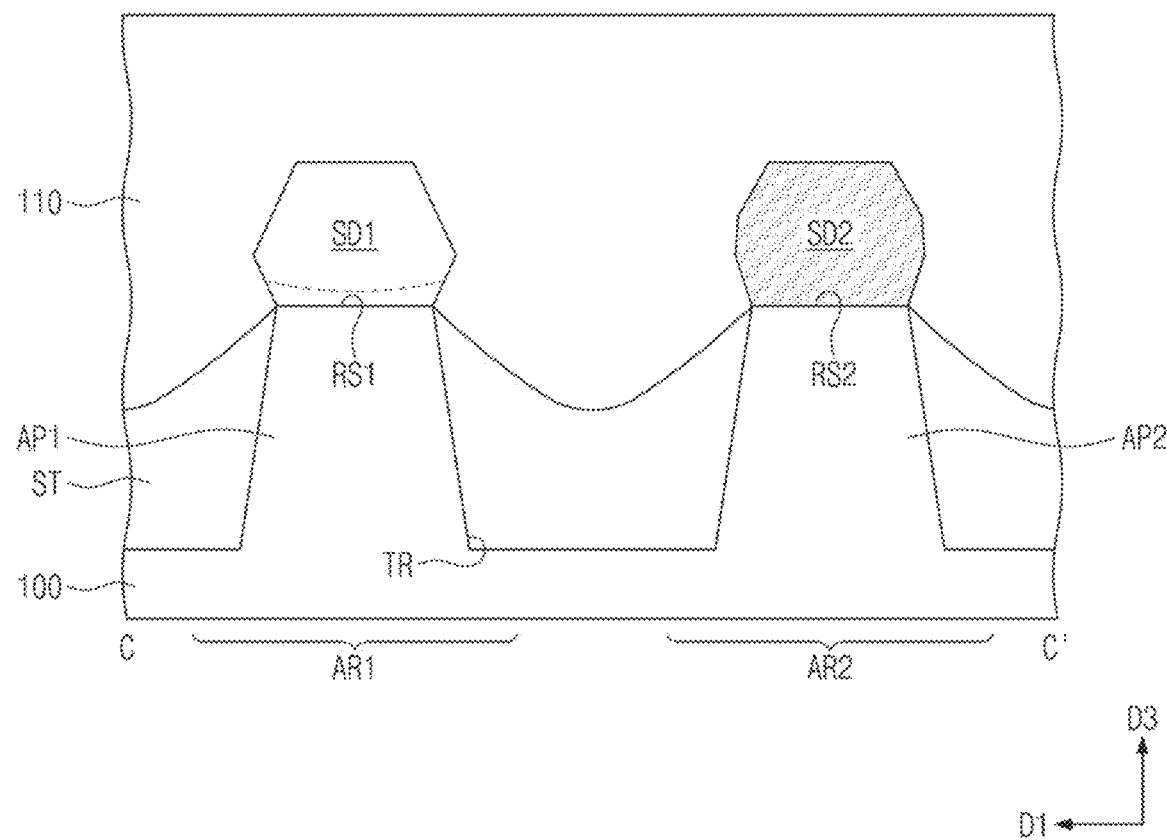
Figure 11D:
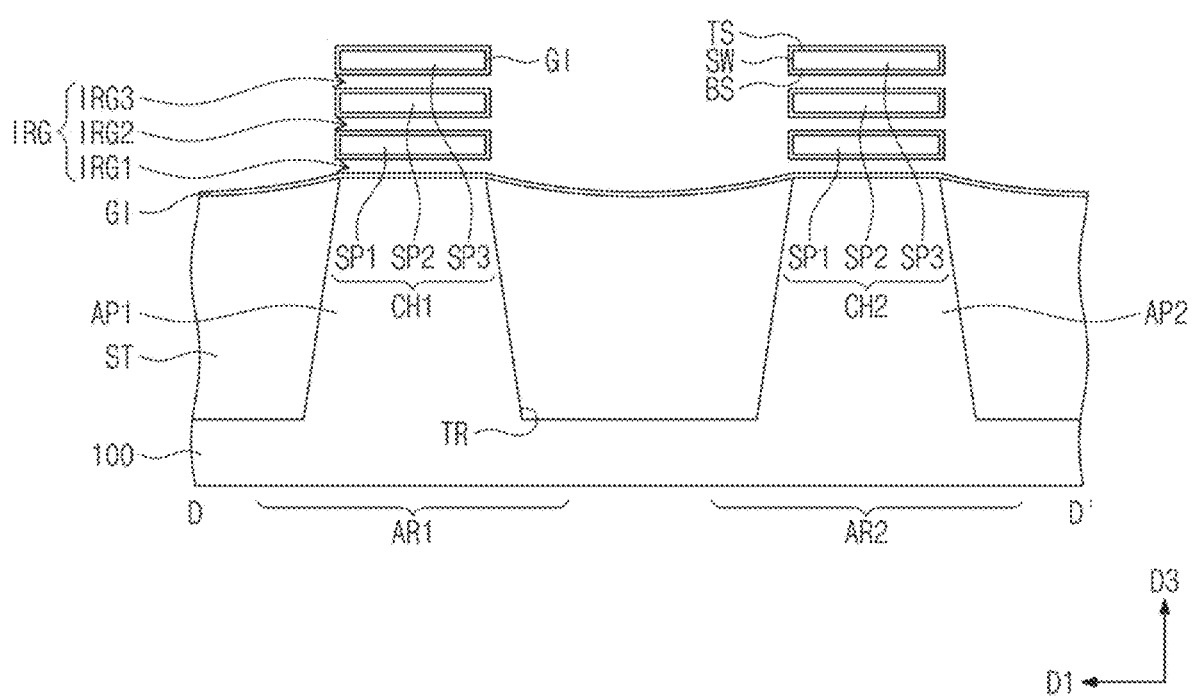
Figure 12A:
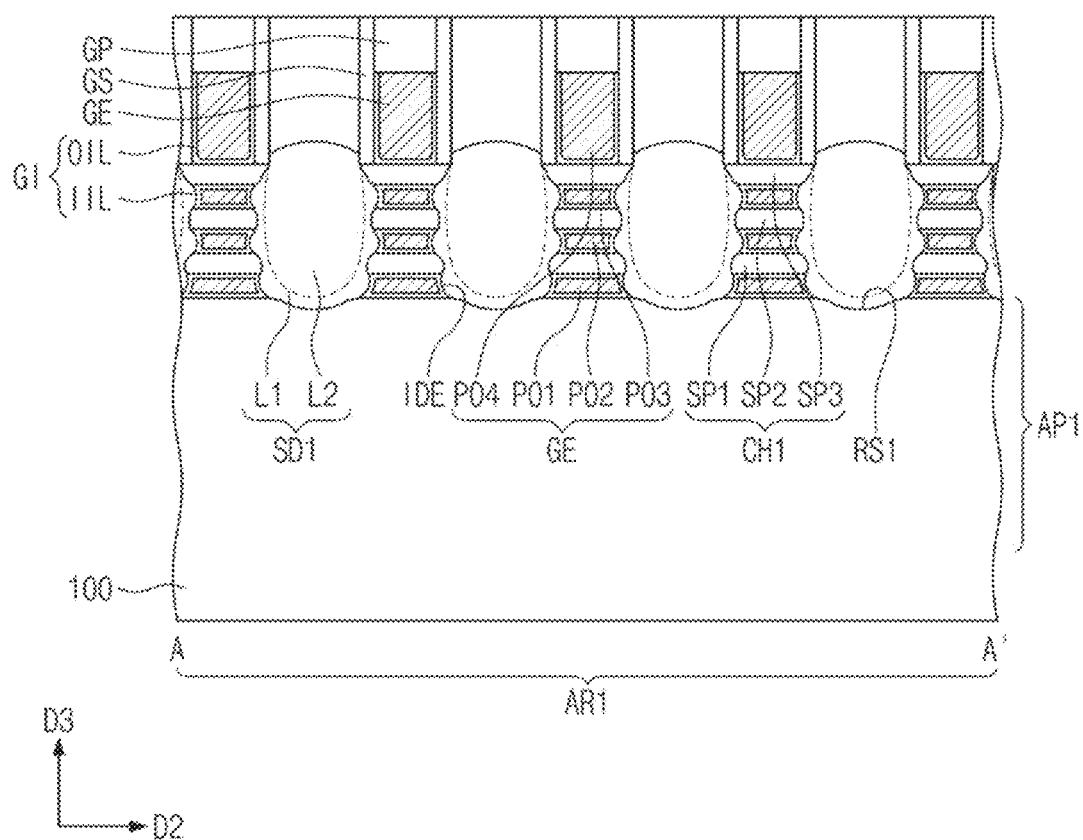
Figure 12B:
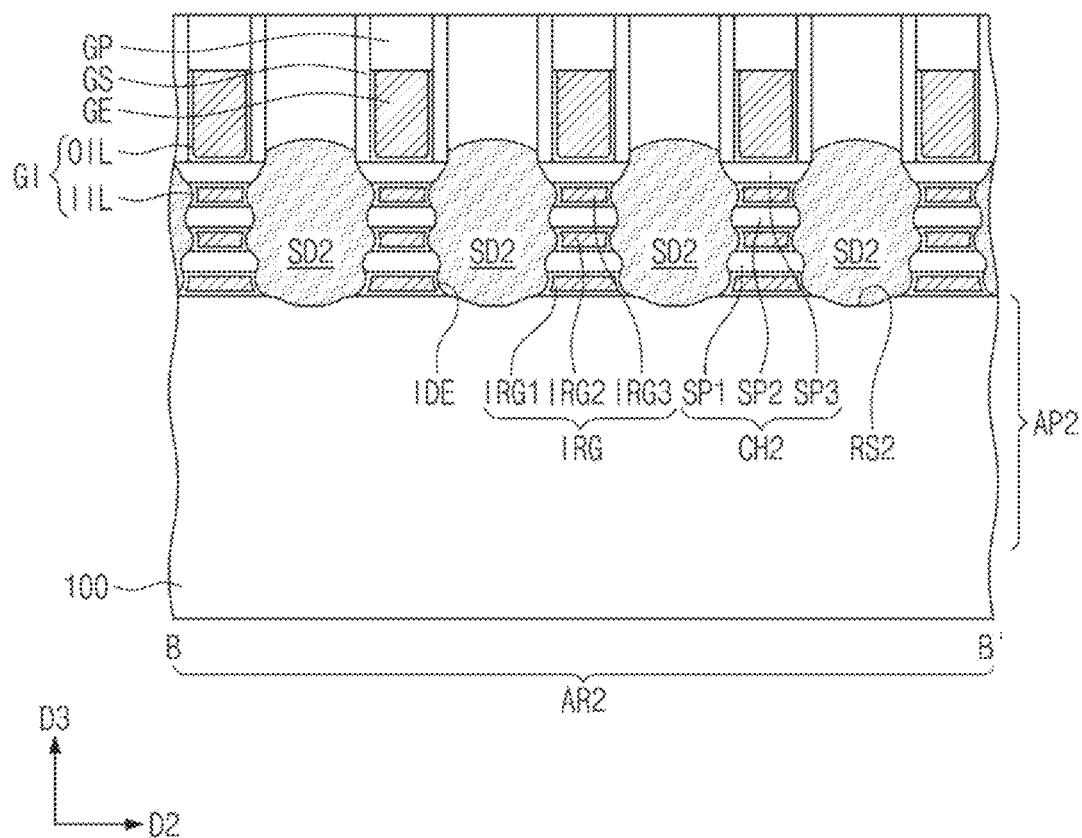
Figure 12C:
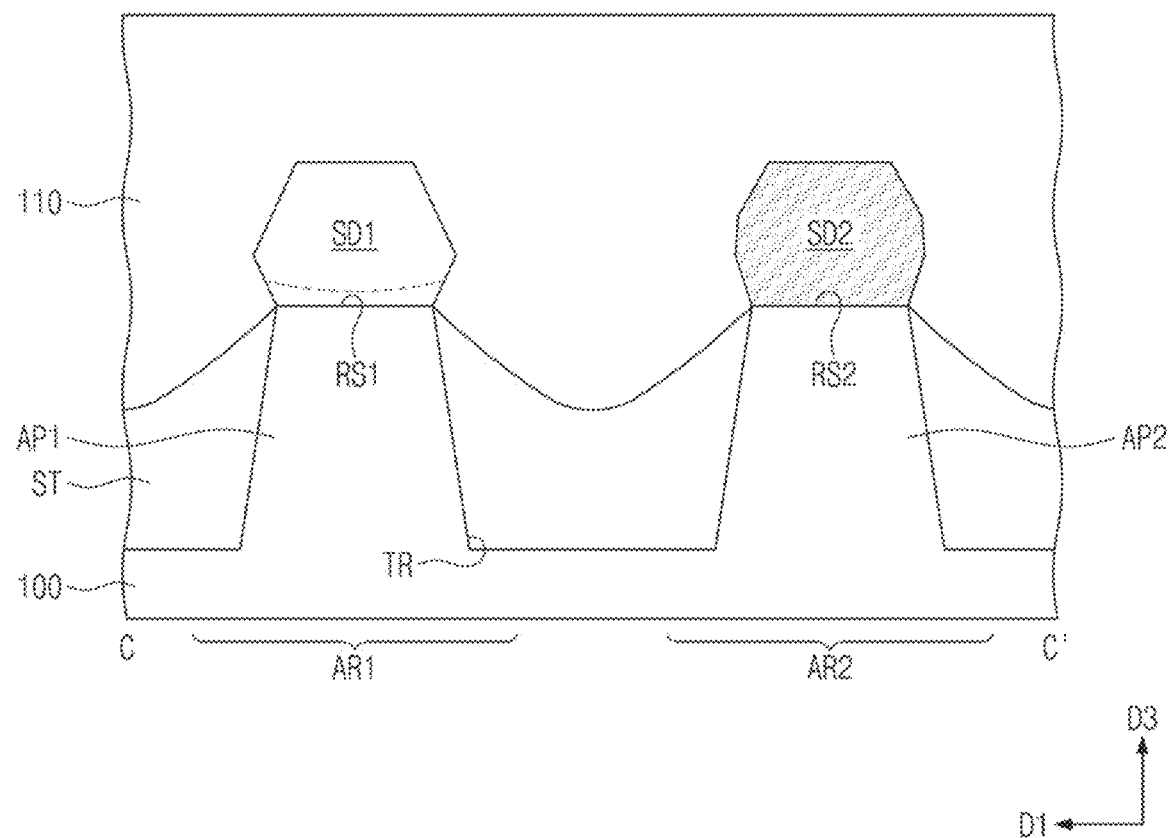
Figure 12D:
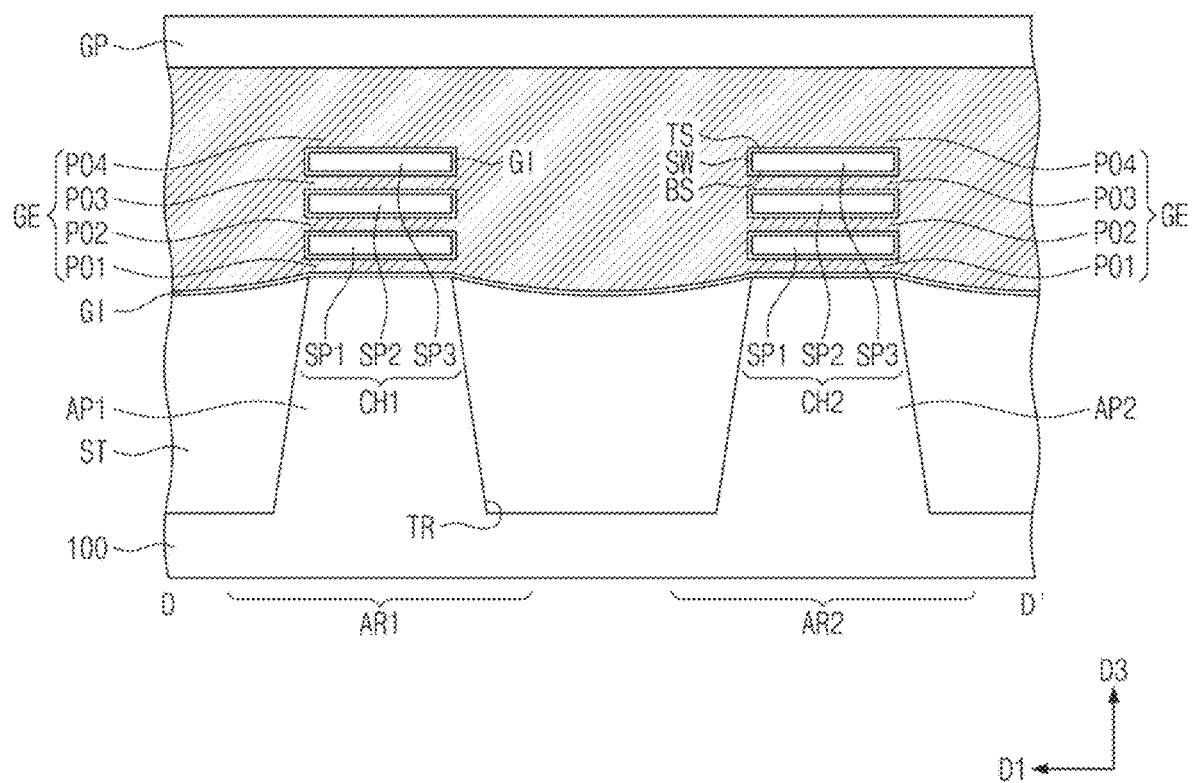

The sacrificial layers SAL exposed through the outer region ORG may be selectively removed to form inner regions IRG (e.g., see FIG. 11D). A process of selectively etching the sacrificial layers SAL may be performed to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than about 10 at %.

During the etching process, the sacrificial layers SAL on the first and second active regions AR1 and AR2 may be removed. The etching process may be a wet etching process. An etchant material, which may be used in the etching process, may be chosen to quickly remove the sacrificial layer SAL having a relatively high germanium concentration.

Referring back to FIG. 11D, as a result of the selective removal of the sacrificial layers SAL, only the stacked first to third semiconductor patterns SP1, SP2, and SP3 may be left on each of the first and second active patterns AP1 and AP2. Hereinafter, empty regions, which are formed by removing the sacrificial layers SAL, will be referred to as first to third inner regions IRG1, IRG2, and IRG3, respectively.

The first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A to 11D, the gate insulating layer GI may be formed on the exposed first to third semiconductor patterns SP1, SP2, and SP3. The gate insulating layer GI may be formed to enclose each of the first to third semiconductor patterns SP1, SP2, and SP3. The gate insulating layer GI may be formed in each of the first to third inner regions IRG1, IRG2, and IRG3. The gate insulating layer GI may be formed in the outer region ORG.

The gate insulating layer GI, which may be formed in the first to third inner regions IRG1 to IRG3, may correspond to the inner gate insulating layer IIL of FIG. 6. The gate insulating layer GI, which may be formed in the outer region ORG, may correspond to the outer gate insulating layer OIL of FIG. 6. The inner gate insulating layer may include the first portion P1 (e.g., of FIG. 6), which may be provided between the inner regions IRG1 to IRG3 and the first layer L1, and the second portion P2 (e.g., of FIG. 6), which may be provided between the inner regions IRG1 to IRG3 and the first channel pattern CH1.

Referring to FIGS. 12A to 12D, the gate electrode GE may be formed on the gate insulating layer GI. The gate electrode GE may be formed on the high-k dielectric layer HK (e.g., of FIG. 6). In other words, a high-k dielectric layer may be formed on the gate insulating layer GI, and the gate electrode GE may be formed on the high-k dielectric layer. The gate electrode GE may include the first to third portions PO1, PO2, and PO3, which are respectively formed in the first to third inner regions IRG1, IRG2, and IRG3, and the fourth portion PO4, which may be formed in the outer region ORG. The gate electrode GE may be vertically recessed to have a reduced height. The gate capping pattern GP may be formed on the recessed gate electrode GE.

Referring back to FIGS. 5A to 5D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include a metal layer and a metal nitride layer. The conductive pattern FM may be formed of or include a low resistance metal.

The division structures DB may be respectively formed on the first and second borders BD1 and BD2 of the single height cell SHC. The division structure DB may penetrate the second interlayer insulating layer 120 and the gate electrode GE and may extend into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

In a three-dimensional field effect transistor according to an embodiment of the disclosure, a gate insulating layer on a side surface of a gate electrode may be used as an inner spacer, and in this case, a distance between an inner electrode of the gate electrode and a source/drain pattern may be increased. In the case where the distance between the inner electrode and the source/drain pattern is increased, a capacitor/gate leakage current may be reduced without any inner spacer. That is, by providing a laterally-thick gate insulating layer, electrical and reliability characteristics of a semiconductor device may be improved.

In a three-dimensional field effect transistor according to an embodiment of the disclosure, a source/drain pattern may be grown, without a step of forming an inner spacer, and an over-growth issue of the source/drain pattern may be suppressed and thereby uniformity of the source/drain pattern may be improved. Furthermore, the gate insulating layer may include a silicon oxide layer or a silicon oxynitride layer, and in this case, a trap charge issue at an interface may be suppressed. Accordingly, improved electrical and reliability characteristics of the semiconductor device may be achieved.

According to example embodiments, an inner gate insulating layer may be used as the inner spacer, and an indent etching step and a SiN deposition step may be omitted in this process. An inner gate insulating layer, which may be formed on a side surface of an inner electrode, may have a thickness that is larger than 1.3 times a thickness of the inner gate insulating layer on top and bottom surfaces. In a case where the inner gate insulating layer is applied to a process of fabricating a semiconductor device, due to a difference in thickness between two portions of the inner gate insulating layer, which are located adjacent to a channel pattern and on the side surface of the inner electrode, improved electrical and reliability characteristics of the semiconductor device may be achieved. Furthermore, since the indent etching step and the step of depositing a SiN-containing inner spacer may be omitted, efficiency in the fabrication process may be increased.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor device, comprising:
a substrate comprising an active pattern;
a channel pattern on the active pattern, the channel pattern comprising a plurality of semiconductor patterns spaced apart from each other;
a source/drain pattern connected to the plurality of semiconductor patterns;
a gate electrode comprising:
an inner electrode between a first semiconductor pattern of the plurality of semiconductor patterns and a second semiconductor pattern of the plurality of semiconductor patterns, the first semiconductor pattern and the second semiconductor pattern being adjacent to each other, and
an outer electrode on an uppermost semiconductor pattern of the plurality of semiconductor patterns; and
a gate insulating layer comprising:
an inner gate insulating layer adjacent to the inner electrode; and
an outer gate insulating layer adjacent to the outer electrode,
wherein the inner gate insulating layer comprises:
a first portion between the inner electrode and the source/drain pattern; and
a second portion between the inner electrode and the first semiconductor pattern, and
wherein a first thickness of the first portion is about 1.3 times to about 3.0 times a second thickness of the second portion.

2. The semiconductor device of claim 1, wherein the first thickness ranges from about 8.0 Å to about 12.0 Å.

3. The semiconductor device of claim 1, wherein the second thickness ranges from about 11.0 Å to about 16.0 Å.

4. The semiconductor device of claim 1, wherein the gate insulating layer comprises a silicon oxide layer or a silicon oxynitride layer.

5. The semiconductor device of claim 1, further comprising a high-k dielectric layer between the inner electrode and the inner gate insulating layer,
   wherein the high-k dielectric layer comprises a uniform thickness; and
   wherein the high-k dielectric layer encloses the inner electrode.

6. The semiconductor device of claim 5, wherein the first portion of the inner gate insulating layer comprises a first side surface contacting the source/drain pattern,
   wherein the high-k dielectric layer comprises a second side surface contacting the first portion,
   wherein the inner electrode comprises a third side surface contacting the high-k dielectric layer, and
   where each of the first side surface, the second side surface and the third side surface comprises a concave portion.

7. The semiconductor device of claim 6, wherein a distance between the first side surface and the second side surface is substantially uniform.

8. The semiconductor device of claim 6, wherein each of the first side surface, the second side surface, and the third side surface comprises a wavy profile.

9. The semiconductor device of claim 1, wherein the outer gate insulating layer comprises:
   a third portion between the outer electrode and a gate spacer; and
   a fourth portion between the outer electrode and the uppermost semiconductor pattern of the plurality of semiconductor patterns, and
   wherein a third thickness of the third portion is substantially equal to a fourth thickness of the fourth portion.

* * * * *